US006446867B1

(12) United States Patent
Sanchez

(10) Patent No.: US 6,446,867 B1
(45) Date of Patent: Sep. 10, 2002

(54) ELECTRO-OPTIC INTERFACE SYSTEM AND METHOD OF OPERATION

(76) Inventor: Jorge Sanchez, 15655 Oakstand Rd., Poway, CA (US) 92064

( * ) Notice: Subject to any disclaimer, the term of this patent is extended or adjusted under 35 U.S.C. 154(b) by 0 days.

(21) Appl. No.: 09/472,709

(22) Filed: Dec. 24, 1999

Related U.S. Application Data

(63) Continuation-in-part of application No. 08/988,865, filed on Dec. 11, 1997, now Pat. No. 6,028,423, which is a continuation of application No. 08/553,340, filed on Nov. 22, 1995, now Pat. No. 5,736,727.

(51) Int. Cl.[7] .................................................. G06K 7/10
(52) U.S. Cl. ...................................... 235/454; 235/492
(58) Field of Search .............................. 235/454, 492; 324/96, 750, 529, 530, 753; 340/854.7, 870.28, 870.03, 870.06; 359/109, 152, 147, 154, 110, 180, 189

(56) References Cited

U.S. PATENT DOCUMENTS

| | | | | |
|---|---|---|---|---|
| 4,745,361 A | * | 5/1988 | Nees et al. ............... | 324/158 R |
| 4,875,006 A | * | 10/1989 | Henley et al. ........... | 324/158 R |
| 4,910,458 A | * | 3/1990 | Forsyth et al. ........... | 324/158 R |
| 5,019,769 A | | 5/1991 | Levinson | |
| 5,272,434 A | * | 12/1993 | Meyrueix et al. ........ | 324/158 R |
| 5,414,345 A | * | 5/1995 | Rogers ....................... | 324/72.5 |
| 5,680,056 A | * | 10/1997 | Ito et al. ..................... | 324/750 |
| 5,844,928 A | | 12/1998 | Shastri et al. | |
| 6,028,423 A | * | 2/2000 | Sanchez ..................... | 324/96 |
| 6,270,728 B1 | * | 8/2001 | Wijnschenk et al. ......... | 235/454 |
| 6,276,605 B1 | * | 8/2001 | Olmstead et al. ........... | 235/454 |

FOREIGN PATENT DOCUMENTS

| | | |
|---|---|---|
| EP | 0759666 | 2/1997 |
| EP | 0911637 | * 4/1999 |
| JP | 57190436 | 11/1982 |
| JP | 61012138 | 1/1985 |

* cited by examiner

Primary Examiner—Karl D. Frech
Assistant Examiner—Uyen-Chau Le
(74) Attorney, Agent, or Firm—Charles F. Reidelbach, Jr.; Higgs, Fletcher & Mack LLP

(57) ABSTRACT

An electro-optic interface system configured to communicate, via an optical channel, an electronic signal between a fist and second electronic system includes a first electro-optic transceiver, an optical channel and a second electro-optic transceiver. The first electro-optic transceiver includes a signal port coupled to the first electronic system and an output coupled to the optical channel and includes a first transceiver emulator circuit, and a first transceiver laser. The first transceiver emulator circuit is configured to receive an electronic signal comprising parallel data from the fast electronic system and, in response, produces the serialized data. The first transceiver laser produces a first modulated output signal corresponding to the electronic signal communicated from the first electronic system. The second electro-optic transceiver includes a first port coupled to the optical channel and a second port coupled to the second electronic system. The second transceiver includes a second transceiver photodetector, and a second transceiver emulator circuit.

20 Claims, 15 Drawing Sheets

ELECTRO-OPTIC INTERFACE SYSTEM AND METHOD OF OPERATION

CROSS-REFERENCES TO RELATED APPLICATIONS

This is a continuation in part of application Ser. No. 08/988,865 filed on Dec. 11, 1997 now U.S. Pat. No. 6,028,423, herein incorporated by reference wherein is a continuation of Ser. No. 08/553,340 Nov. 22, 1995 now U.S. Pat. No. 5,736,727. In addition, the commonly owned, concurrently filed provisional U.S. patent application entitled "Drive Controller and Method of Operation," Ser. No. 60/173,056 is herein incorporated by reference in its entirety for all purposes.

BACKGROUND

The present invention relates to an electro-optic communication system and more specifically to an electro-optic interface system configured to optically communicate signals between two or more electronic systems.

Conventionally, electronic systems such as PCs, Internet Servers and Computer Peripherals utilize a variety of metal cables and interface circuits for interconnection purposes in order to transmit bidirectional information. These interfaces host a variety of communication protocols between the different devices. In many cases, these interfaces limit the performance of the transmission system. Common problems limiting metal cable performance include significant degradation due to problems caused by Radio Frequency Interference (RFI), data transmission speed limitations due to the constrained transmission capability of the cable utilized by standard interfaces (twisted pair, coax cable and other types of interfaces), limited transmission distances for sending data and information due to the limitations of the electronics' transmission system over metal lines.

Fiber optic interface systems have been proposed as a possible solution to many of the aforementioned problems. As a result, fiber optic interface systems have been developed in specific applications for connecting electronic systems such as computers and peripherals. Unfortunately, the existing fiber optic interface systems usually consist of highly complex interface cards, which connect to the back plane of the PC or server host with an adapter card. The adapter card typically includes relatively slow speed electronics needed to drive the fiber optic interface and to establish the necessary protocol to interface with the Host Computer or the Computer Peripheral. As a result, conventionally implemented fiber optic interface systems suffer from limited data rates and bandwidth.

What is needed is an electro-optic interface system which will provide a high speed, high frequency communication link between two or more electronic systems.

SUMMARY OF THE INVENTION

The present invention provides an electro-optic system and method of operation for communicating high frequency analog and high speed digital signals between two or more electronic systems.

In one embodiment of the invention, an electro-optic transceiver configured to communicate signals between an electronic system and an optical system is presented. The electro-optic transceiver includes a test system switch, a laser, and a photodetector. The test system switch includes a signal port configured to communicate electronic signals between the test system switch and the electronic system, a control input configured to receive a switch control signal, a first signal output, and a first signal input. The laser includes an input coupled to the first signal output of the test system switch and an optical output coupled to the optical system. The photodetector includes an optical input coupled to the optical system and an output coupled to the first signal input of the test system switch, the photodetector being configured to receive an optical signal from the optical system and in response produce a received signal. The test system switch, responsive to the switch control signal, couples the electronic signal to the laser input to produce a first modulated output signal, thereby communicating the electronic signal from the electronic system to the optical system, or couples the received signal to the electronic system, thereby communicating the optical signal from the optical system to the electronic system.

In a second embodiment of the invention, an electro-optic interface system configured to communicate, via an optical channel, an electronic signal between a first and a second electronic system is presented. The electro-optic interface system includes a first electro-optic transceiver, an optical channel and a second electro-optic transceiver.

The first electro-optic transceiver includes a signal port coupled to the first electronic system and an output coupled to the optical channel and includes a first transceiver emulator circuit, and a first transceiver laser. The first transceiver emulator circuit is configured to receive an electronic signal comprising parallel data from the first electronic system and, in response, produces serialized data. The first transceiver laser produces a first modulated output signal corresponding to the electronic signal communicated from the first electronic system.

The second electro-optic transceiver includes a first port coupled to the optical channel and a second port coupled to the second electronic system. The second transceiver includes a second transceiver photodetector, and a second transceiver emulator circuit. The second transceiver photodetector is configured to receive the first modulated output signal emitted by the first transceiver laser and, in response, produces a first received signal. The second transceiver emulator circuit is configured to receive the received signal comprising serialized data and to produce in response parallel data.

The nature and advantages of the present invention will be better understood with reference to the following drawings and detailed description.

DESCRIPTION OF THE SPECIFIC EMBODIMENTS

Table of Contents

I. Definition of Terms
II. Electro-Optic Interface System Architecture
III. Electo-Optic System Operation
IV. Link characterization
V. Applications I. Definition of Terms As used herein, the term "laser" refers to a light emitting device, including but not limited to a laser diode or circuit, a light emitting diode (LED), or other optically transmitting devices. The laser may be formed separately or integrated with other devices or circuitry, for instance a monitoring photodiode, temperature sensing circuitry, or a heating and/or cooling element.

As used herein, the term "electronic system," refers to any device, component or system which processes and/or communicates information in electronic form. Possible examples of electronic systems include computers or other electronic processor-controller systems, electronic test equipment, electronic circuitry, electronically based amplifiers, oscillators, filters, transistors, or other components, and electronic portions of electro-optic components such as lasers and photodetectors.

As used herein, the term "optical channel" or "optical link" refers to any medium capable of supporting the propagation of a desired wavelength of light. Some examples of an optical channel include a fiber optic cable or other guided medium, a terrestrial or space-based free-space link, or links established in and/or through other mediums such as an aqueous environment through which the desired wavelength of light may be propagated.

II. Electro-Optic Interface System Architecture

Figure 1A:
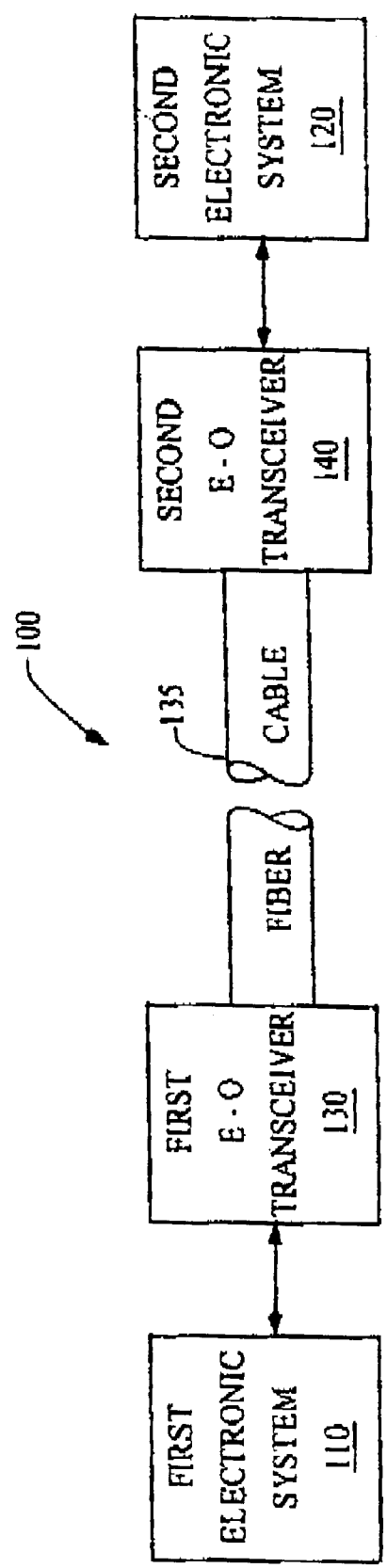
FIG. 1A illustrates a first embodiment of an electro-optic interface system in accordance with the present invention.

FIG. 1A illustrates a first embodiment of an electro-optic (e-o) interface system 100 configured in accordance with the present invention. The e-o interface system 100 includes first and second electronic systems 110 and 120 coupled via a fiber optic cable 135 and first and second electro-optic transceivers 130 and 140, respectively. It will be appreciable to those of skill in the art that the invention is not limited to communicating signals between two electronic systems, and that three or more electronic systems may also be connected. Further, the electronic systems 110 and 120 may be an electronic, component, circuit, device or system of any type. Additionally, optical communication may be made through the use of free-space lasers and receiver components as an alternative to the fiber optic cable 135.

Figure 1B:
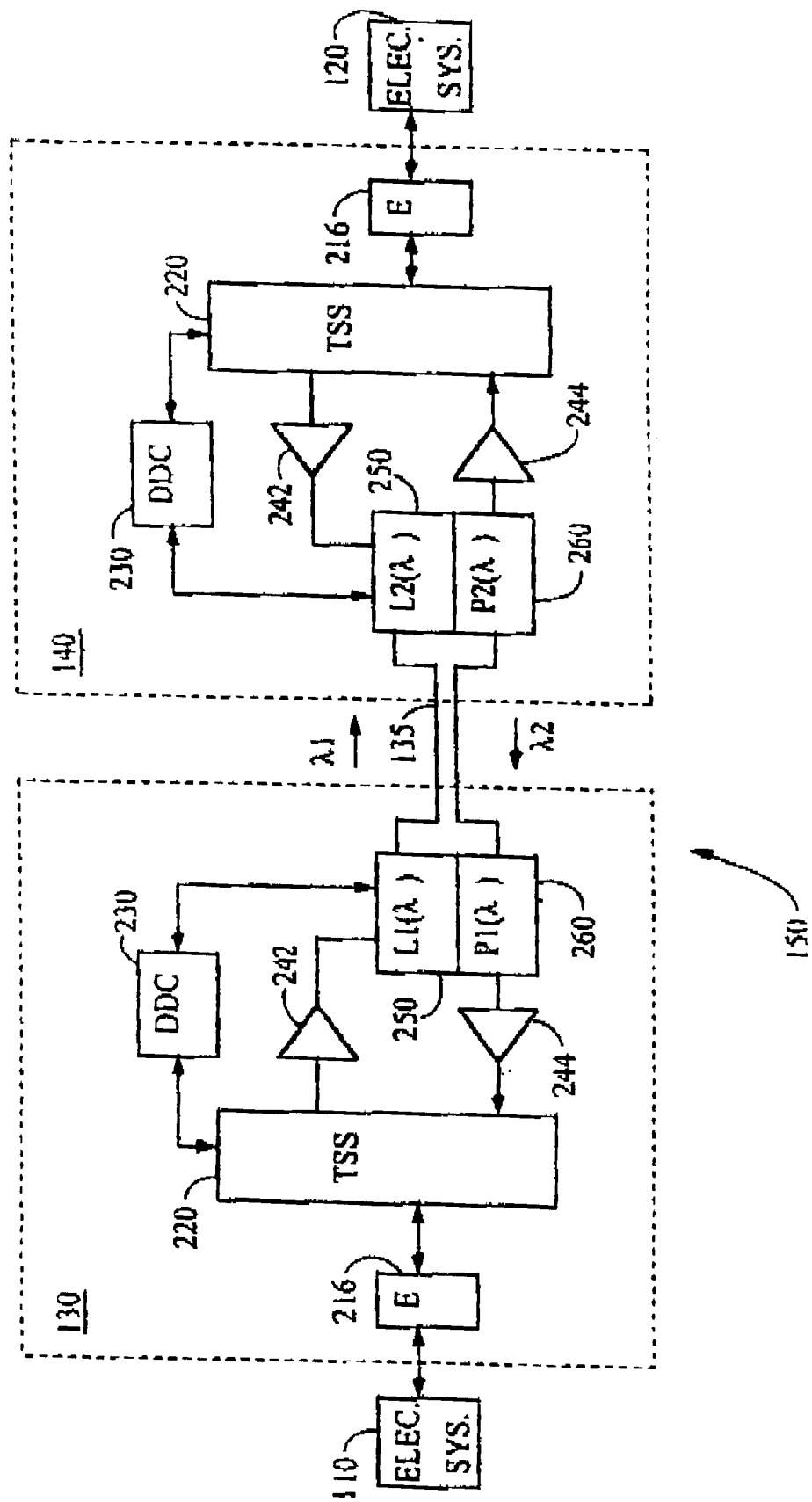
FIG. 1B illustrates a second embodiment of an electro-optic interface system in accordance with the present invention.

FIG. 1B illustrates a second embodiment of an electro-optic communication system in accordance with the invention. A description of this embodiment is further provided below.

Figure 2A:
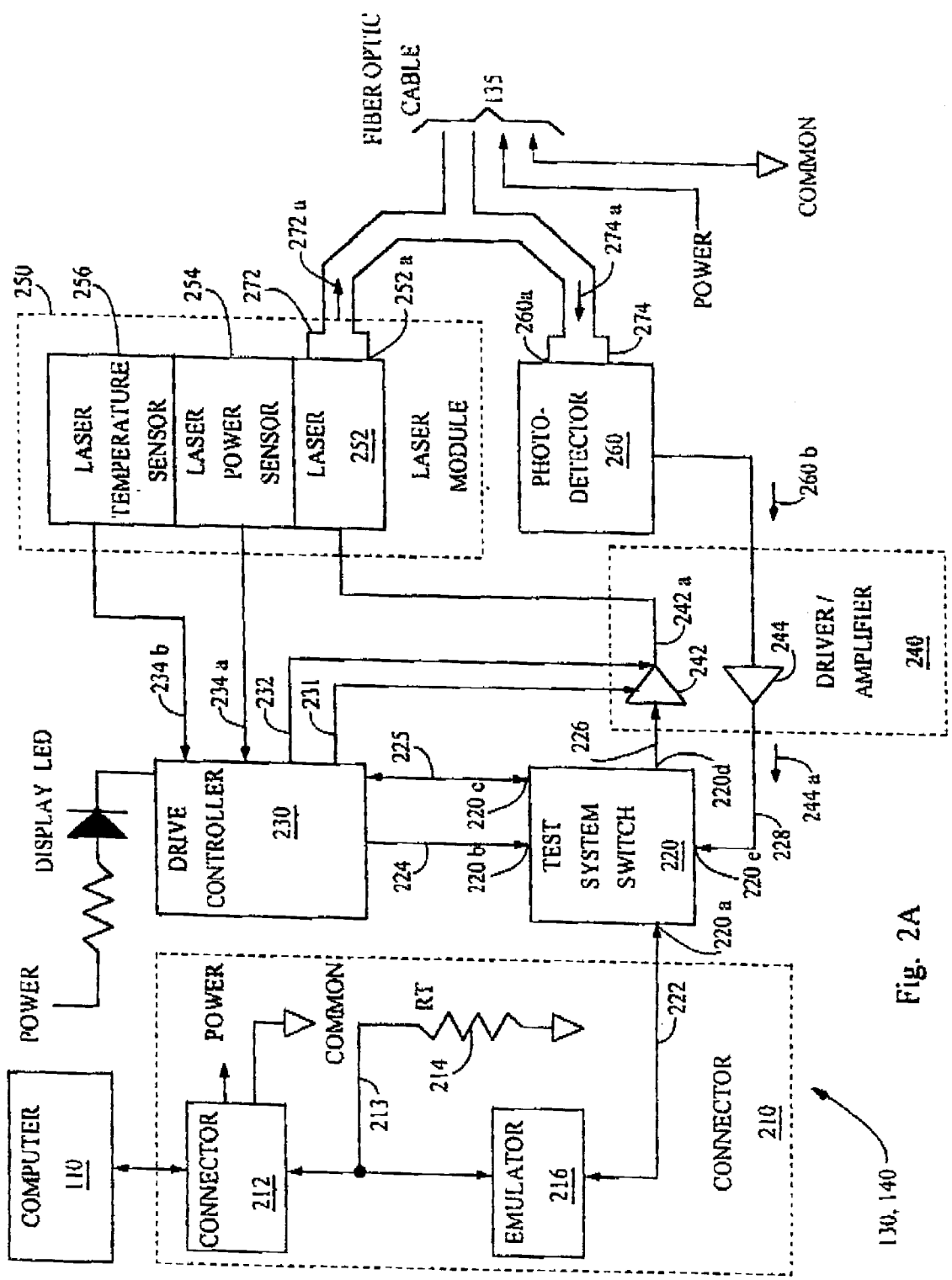
FIG. 2A illustrates a first embodiment of an electro-optic transceiver in accordance with the present invention.

FIG. 2A illustrates a first embodiment of the first and second e-o transceivers 130 and 140 for use with the system shown in FIGS. 1A and 1B. The e-o transceiver 130,140 includes a host interface 210, a test system switch 220, a drive controller 230, an amplifier/driver assembly 240, a laser transmitter 250, a photodetector 260. The laser transmitter 250 and photodetector 260 are coupled to a fiber optic cable 135 via fiber connectors 272 and 274, respectively.

The host interface 210 includes a connector 212, a bus 213, and an emulator circuit 216. The connector 212 is configured to efficiently communicate parallel and/or serial digital data, analog signals, as well as control, power, and other signals between the first electronic system 110 and the e-o transceiver 130.

Depending upon the application, the connector 212 may take a multitude of various forms. For instance, in one embodiment, the connection 212 may be a Universal Serial Bus (USB) connector used to communicate serial data between the electronic systems 110 and 120 comprising a host computer 110 and a peripheral unit 120. In a second embodiment, the connector 212 may be a small computer system interface (SCSI) connector operable to communicate parallel data to and from the first computer 110. Other connector types, such as shielded or unshielded plugs, microwave frequency connectors such as a SMA connector, or specially designed connectors may be used depending upon the type of electronic system 110 generating the data.

Signal communication to and from the computer 110 is provided via a signal bus 213. The signal bus 213 may include one or more serial and/or parallel lines for communicating data, control lines, power lines, and the like. The signal bus 213 may comprise a USB or SCSI bus for communicating serial or parallel data, respectively, to/from a host computer 110. In another embodiment, the signal bus 213 may comprise a general purpose instrument bus (GPIB) used to communicate signals between remotely located electronic test equipment components. In a fourth embodiment, the signal bus 213 includes high frequency transmission lines configured to communicate signals in the HF, VHF, UHF, EHF, RF, microwave, millimeter wave frequency range. As those of skill in the art will appreciate, the present invention is applicable to a wide variety of electronic systems, and accordingly, bus configurations used therewith may be implemented.

One or more terminating resistors 214 may be coupled to the signal line(s) along the signal bus 213 in order to reduce signal reflections occurring therealong. In one embodiment, the terminating resistor(s) has a resistance value which aids to match the output impedance of the computer 110 to the characteristic impedance of the signal line(s). In a specific embodiment, the terminating resistor is substantially 50 ohms, although other values, higher and lower, may be used in alternative embodiments.

The host interface 210 may further include an emulator circuit 216. The emulator circuit 216 operates in a manner that is substantially transparent to the computer or other electronic system and provides substantially real time communication between electronic systems 110 and 120 without reproduction of most or all of the I/O protocol as in the conventional system.

Figure 2B:
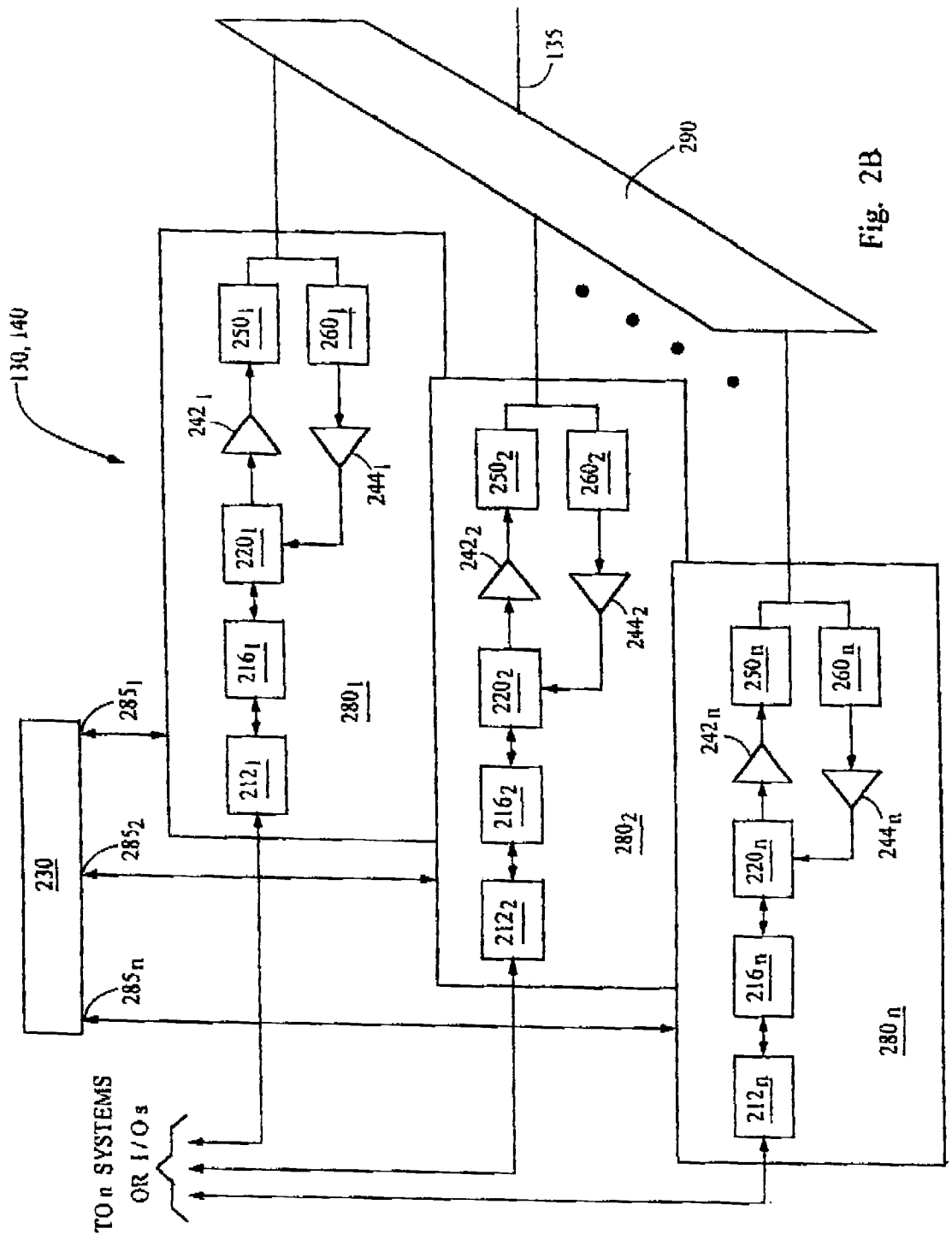
FIG. 2B illustrates a second embodiment of an electro-optic transceiver in accordance with the present invention.

FIG. 2B illustrates a second embodiment of an e-o transceiver 130,140 configured to operate in a wavelength division multiplexed (WDM) system. This embodiment is further described below.

Figure 3A:
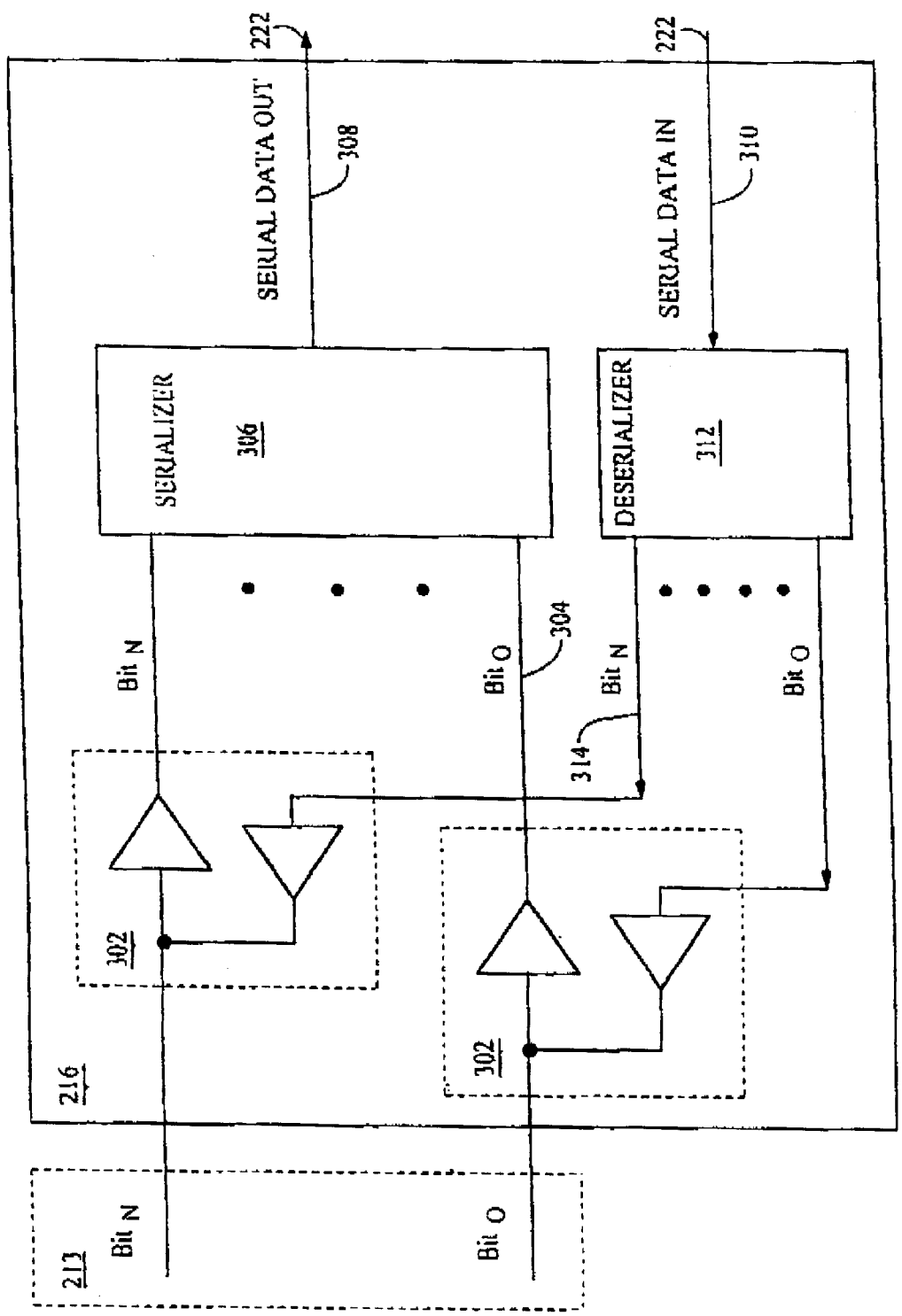
FIG. 3A illustrates a first embodiment of an emulator circuit in accordance with the present invention.

FIG. 3A illustrates an exemplary embodiment of the emulator circuit 216 in accordance with the present invention. The emulator circuit 216 includes n bus transceivers 302, an n×1 data serializer 306, and a 1×n data de-serializer 312.

During data transmission from the computer 110, n-bit parallel data is communicated along the computer bus 213 to the emulator 216. The n bus transceivers 302 are coupled to condition and output the parallel data 304 to the n×1 data serializer 306. The n×1 data serializer 306 re-orders the incoming parallel data to produce a serial data stream 308. In one embodiment, the n×1 data serializer 306 includes a system clock and an encoder configured to encode the data with a time stamp to aid in parallel data reconstruction during reception within the second e-o transceiver 140.

During data reception, serialized data 310 transmitted from the peripheral device 120 is received from the test system switch 220 and input to the 1×n data deserializer 312. The 1×n data de-serializer 312 performs the inverse function of the data serializer 306, i.e., it restores the incoming serial data to its originally transmitted n-bit parallel form. In the illustrated embodiment, the 1×n data de-serializer 312 includes a data decoder to extract the encoded time stamp of the serialized data to aid in the parallel reconstruction of the data. The restored parallel data 314 is supplied to bus transceivers 302, which conditions and outputs the parallel data to the first computer bus 213. Possible examples of the n×1 data serializer 306 and 1×n de-serializer 312 which may be used, include the 16-bit, 2.5 Gbps MAX3880 and MAX3890, available from the Maxim Corporation of Sunnyvale, Calif. Of course, serializers and de-serializers of other bit capacity, transmission rate, and functionality may be used with the present invention.

The emulator 216 may include additional hardware, software, and/or firmware to enhance operation. A few of the possible additions include local memory buffers, direct memory access (DMA) control, operating system protocol, firmware, and threshold detectors operable to determine the state of multi-level logic used, for instance, in some forms of USB protocols. Those skilled in the art will appreciate that other hardware, software and/or firmware may be used alternatively, or in addition to that described herein.

Figure 3B:
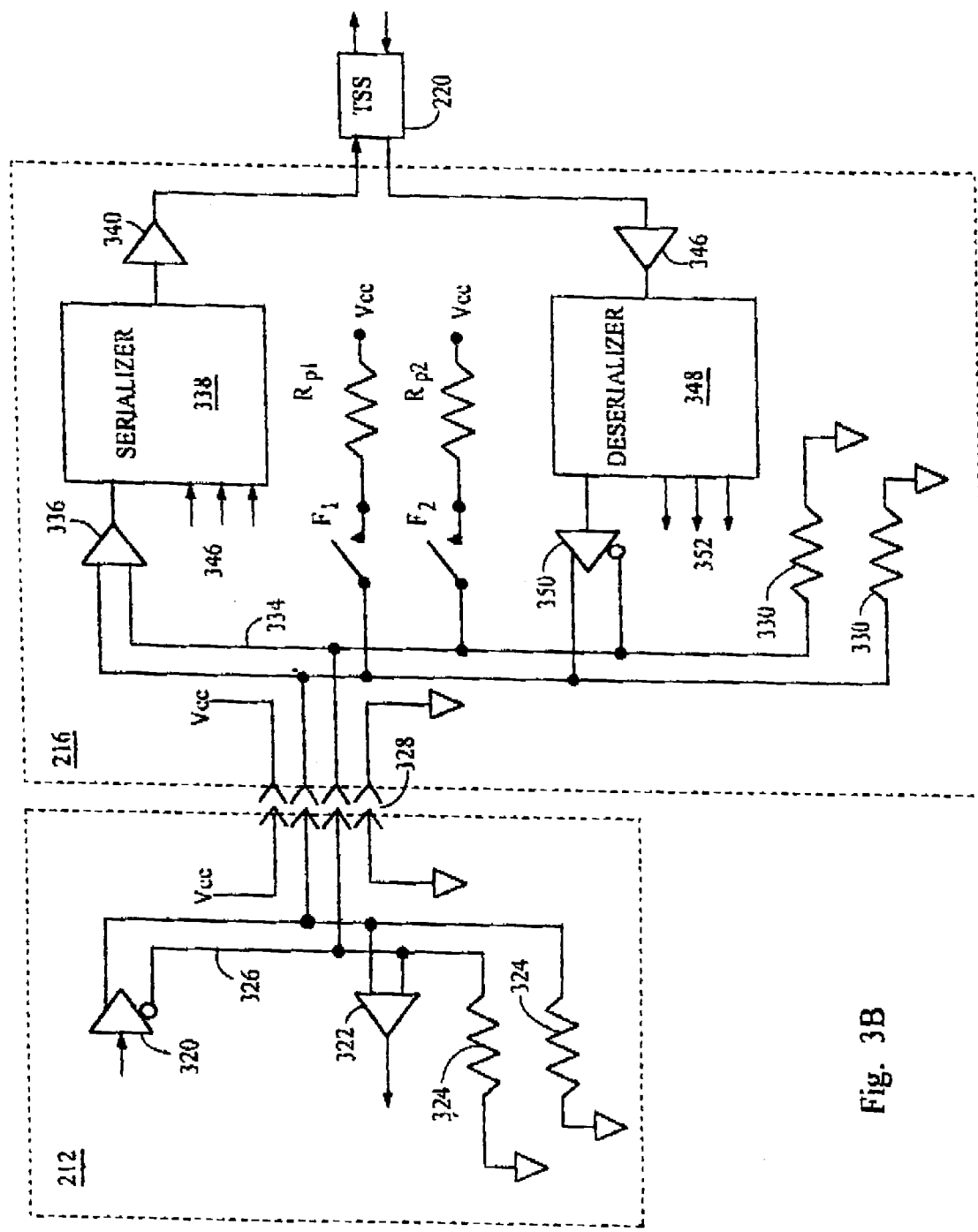
FIG. 3B illustrates a second embodiment of the emulator circuit in accordance with the present invention.

FIG. 3B illustrates a second embodiment of the emulator 216 configured to operate with a USB 2.0 bus in accordance with the present invention. The emulator 216 is connected to a standard USB transceiver 212 having a high speed current driver 320 configured to drive a differential signal on the USB 2.0 bus 326. The transceiver 212 further includes a high speed differential data receiver 322 configured to receive differential data and convert it to a single-ended mode. The transceiver 212 may further include pull down resistors 324 in conformance with the USB interface specification. The emulator 216 may include pull up resistors Rp coupled to a power supply Vcc and switches as dictated by the USB specs. The two differential signal lines as well as power and ground lines are connected to the emulator 216 at the USB interface 328.

The emulator 216 includes transmitting circuitry including a differential-to-single-ended receiver 336, a serializer 338, and a buffer 340. The differential-to-single-ended receiver 336 receives the differential signal from the differential bus 334 and converts it to a single ended signal. The serializer 338 operates in the manner described above and may include circuitry to time stamp and encode the processed data to aid in construction during reception at the second e-o transceiver 140. The serializer 340 may further include additional inputs 346 to receive other signals generated and/or received by the emulator 216 for transmission to the second e-o transceiver 140. A buffer 340 is coupled between the serializer 338 and the test system switch 220 to provide the level shifting, impedance matching, isolation, amplification or other signal conditioning needed to match the serializer output to the test system switch input. Terminating resistors 330 are used to terminate signals The emulator 216 further includes reception circuitry designed to perform the inverse of the emulator's transmitting circuitry. The reception circuitry includes a buffer 346, a de-serializer 348 and a single-ended-to-differential driver 350. The buffer 346 is coupled to the test system switch 220 and provides the signal conditioning necessary to receive the received signal into the de-serializer 348. The de-serializer 348 operates as described above, restoring the incoming serial data to its originally transmitted parallel form. The de-serializer 348 may include a data decoder to extract the encoded time stamp of the serialized data to aid in the parallel reconstruction of the data. The de-serializer may further include signal outputs 352 configured to provide additional signals transmitted from the emulator or other circuit within the second e-o transceiver 140. The single-ended to differential driver 350 receives the de-serialized data and drives the differential bus 334 in an appropriate manner.

Those of skill in the art will further appreciate that the illustrated embodiments represent only a few of the possible emulator circuits and that other emulator circuits compatible with other bus architectures may be constructed based upon the foregoing description. A variety of different emulator circuits may be constructed to support signal communication between the electronic system 110 and the e-o transceiver 130 consistent with the implemented bus architecture.

Referring again to FIG. 2A, the emulator circuit 216 is coupled to a signal port 220a of the test system switch 220 via an emulator signal line 222. The emulator signal line 222 may consist of a single bi-directional line, or separate signal lines configured to communicate emulator data (e.g., 308 and 310 in FIG. 3A) to and from the first computer 110.

The test system switch 220 includes a control input 220b coupled to control line 224 and a second signal port 220c coupled to signal line 225. The drive controller 230 controls the state of the test system switch 220 via control line 224. In addition, the drive controller 230 communicates signals to and from the test system switch 220 via signal line 225. The signal line 225 may be used to perform a link characterization, the process of which is further described below. The signal line 225 may consist or a single, bi-directional line or separate signal lines configured to communicate data to and from the test system switch 220. In a further embodiment, control and signal lines 224 and 225 may comprise a bus operable to communicate data, control, ground and/or power signals.

Table I illustrates the signal paths which the test system switch 220 connects during transceiver transmission, reception, and link characterization (described below) processes. During signal transmission, the test system switch 220 connects signal port 220a to the first output port 220d, thereby connecting signal line 222 to 226. During signal reception, the test system switch 220 connects the first input port 220e to the signal port 220a, thereby connecting signal line 228 to 222. The test system switch 220 is operable in additional states to perform diagnostic tests locally and on the communication link between e-o transceivers 130 and 140. This process is described in detail in Table I.

TABLE I

Signal Paths for Test System Switch

| | Line(s) 222 | Line(s) 225 | Line(s) 226 | Line(s) 228 |
|---|---|---|---|---|
| Line(s) 222 | | 225←222 Local Link Test | 226←222 Transmission | 222←228 Reception |
| Line(s) 225 | 225←222 Local Link Test | | 226←225 Link test | 225←228 Link test |
| Line(s) 226 | 226←222 Transmission | 226←225 Link Test | | 226←228 Link test |
| Line(s) 228 | 222←228 Reception | 225←228 Link test | 226←228 Link test | |

Figure 4:
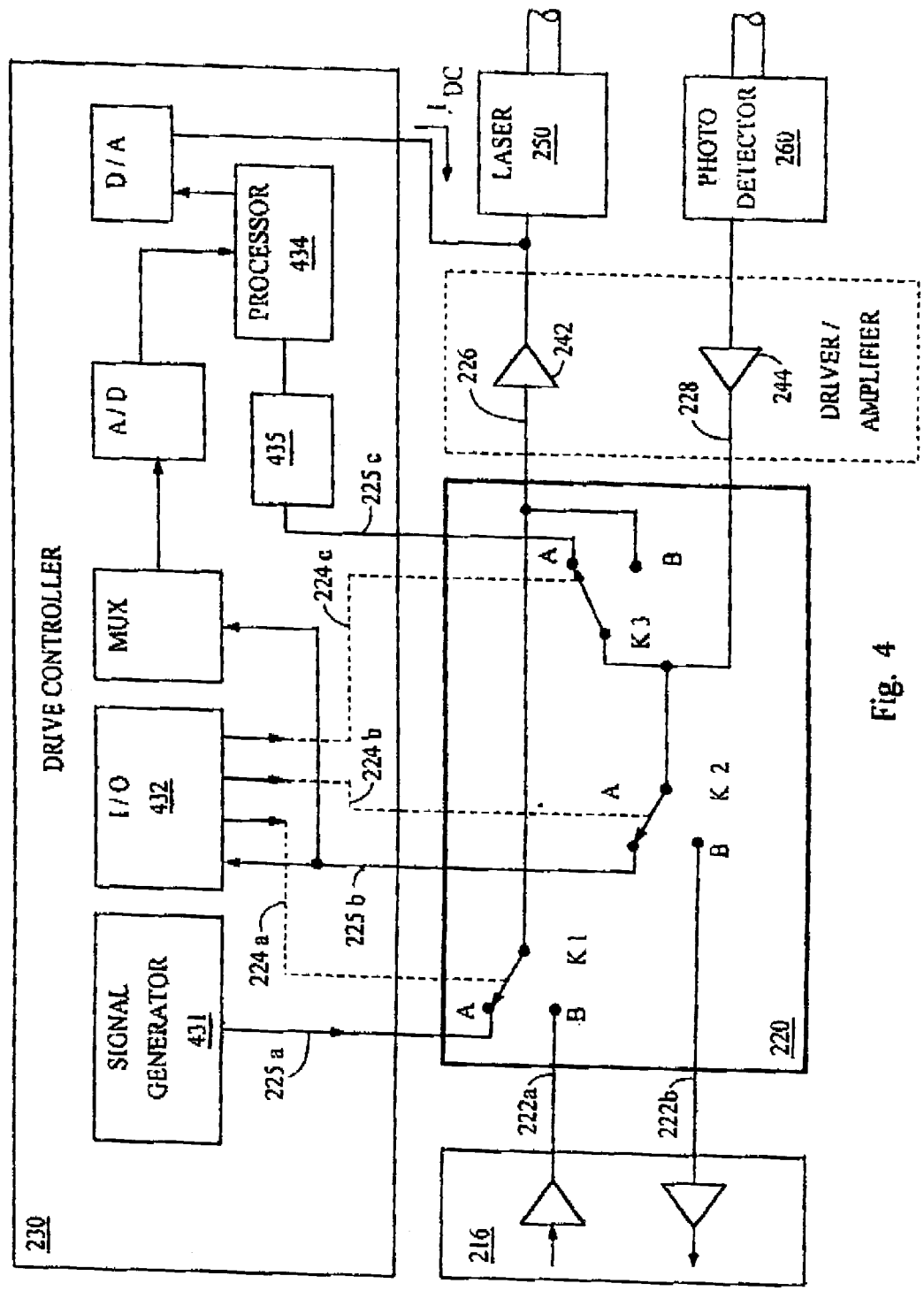
FIG. 4 illustrates one embodiment of the test system switch in accordance with one embodiment of the present invention.

FIG. 4 illustrates one possible embodiment of the test system switch 220 in accordance with one embodiment of the present invention. The test system switch 220 includes (3) single-pole, double-throw switches K1, K2 and K3. The switch K1 has a pole coupled to the signal output line 226, a first throw A coupled to a drive controller/output signal line 225a, and a second throw B coupled to an emulator output signal line 222a. The switch K2 has a pole coupled to the signal input line 228, a first throw A coupled to a drive controller/input signal line 225b, and a second throw B coupled to an emulator signal output line 222b. The switch K3 includes a pole also coupled to the signal input line 228, a first throw A coupled to a drive controller/signal detector input 225c, and a second throw B coupled to the output signal line 226.

During transceiver transmission, switch K1 is controlled via control line 224a to connect emulator output signal line 222a to the signal output line 226. As a result, the signal to be transmitted (serialized data 308 in the illustrated embodiment) is supplied to the laser driver/amplifier 242. During transceiver reception, switch K2 is controlled via control line 224b to connect the signal input line 228 to emulator input signal lines 222b. This connection allows the photodetector amplifier output (serialized data 310 in the illustrated embodiment) to be supplied to the emulator 216.

The test system switch 220 also operates in a link characterization mode, further described below. During a link characterization, switch K1 is controlled via control line 224a to couple in the signal generator 431 of the drive controller 230 to the laser driver/amplifier 242. As further described in applicant's concurrently filed provisional patent application entitled "Drive Controller and Method of Operation," application Ser. No. 60/173,056, signal generator 431 provides a reference signal which may be a dc or ac signal, in either analog or digital form. During this operation, switches K2 and K3 are preferably switched to position A.

Within the second e-o transceiver 140 during link characterization, the test system switch 220 is controlled to configure a return shunt path. Specifically, switch K3 is controlled to occupy position A to route the photodetector output 228 to a code detector 435 located within the drive controller 230. The photodetector output 228 has a characteristic such that the code detector 435 will recognize the receipt of such a signal as the initiation of a link characterization. In one embodiment the photodetector output 228 is a predefined binary word. Once received, the code detector 435 subsequently supplies an output to the drive controller processor 434 informing the processor 434 that a link characterization is underway.

Responsive to the received digital potentiometer output, the processor 434 instructs the I/O controller 432 to switch (via control line 224c) switch K3 to position B thereby connecting the photodetector amplifier output 228 to the laser driver/amplifier input 226. This configures the shunt return path within the second e-o transceiver 140. The laser driver/amplifier 242 conditions the signal and outputs a driving signal to modulate the laser module 250, thereby providing a returning optical signal to the first e-o transceiver 130. Preferably, the second e-o transceiver I/O controller 432 controls switches K1 and K2 to occupy position A.

Within the first e-o transceiver 130, the returned optical signal illuminates the photodetector 260. The photodetector 260 outputs a return reference signal which is further conditioned by the photodetector amplifier 244. The switch K2 is set to position A if not already engaged, thereby routing the returned reference signal at the photodetector output 228 to the I/O signal input 225b. As further described below, the drive controller 230 subsequently compares the reference signal output from the signal generator 431 and the returned reference signal received from the photodetector amplifier output 228 to determine the existence and quality of the communication link.

The test system switch 220 is selected to operate with minimal signal loss and distortion over the desired frequency range of interest. An exemplary embodiment of the test system switch includes the series UM1 high frequency switches manufactured by the Fujitsu Corporation of Japan.

Referring again to FIG. 2A, the e-o transceiver 130, 140 further includes a drive controller 230 configured to control the operation of the laser transmitter module 250 as well as other operating conditions of the of the e-o transceivers 130, 140. The construction and operation of the drive controller 230 is further described in the concurrently filed, provisional patent application entitled "Drive Controller and Method of Operation," Ser. No. 60/173,056.

Each of the e-o transceivers 130, 140 further includes a driver/amplifier assembly 240. The driver/amplifier 240 includes a laser driver/amplifier 242 and a photodiode amplifier 244. The laser driver/amplifier 242 is used to provide a driving signal 242a to the laser module 250. The laser driver/amplifier and has an input signal port coupled to the test system switch 220 via signal line 226, an output signal port, and a control port coupled to the drive controller 230.

In the illustrated embodiment in which the electronic signals are digital serialized data, the laser driver/amplifier 242 is operable to provide sufficient gain/attenuation such that the driving signal 242a corresponding to a "0" or lowest logic level received produces a driving signal which is slightly above the threshold current of the laser 252. In another embodiment in which linear operation is desired and analog signals are provided, the laser driver/amplifier provides sufficient gain and output power such that the driving signal 242a corresponding to the applied linear signal modulates the laser 252 over a substantially linear region of the laser output power response ($P_{out}$vs.-$Signal_{in}$).

The laser driver/amplifier 242, may, in one embodiment be a variable gain/output power amplifier in which the gain or output power of the incoming signal is programmable by the direct drive controller 230 via control line 231. The driver amplifier is preferably a high speed/high frequency digital or analog driver circuit capable of handling high speed digital or high frequency analog signals with minimal distortion. For instance, the laser driver/amplifier 242 may be operable to process signals within the LF, MF, HF, VHF, UHF, EHF, microwave, and millimeter wave bands or anywhere therebetween.

In one embodiment, the laser driver/amplifier 242 forms a voltage-controlled current source used to drive the laser module 250. In this embodiment, the laser driver/amplifier 242 may include an operational amplifier such as part number AD8001 operational amplifier available from Analog Devices Corporation. The amplifier's output is coupled to the base terminal of a high speed/ high frequency transistor, such as part number MMBR941 available from the Motorola Corporation. The amplifier's inverting input is coupled to the emitter terminal of the transistor and an emitter resistor coupled therebetween and ground. The noninverting input is used as the voltage input to generate the necessary current output at the transistor's collector terminal. The foregoing represents only one of many possible laser driver/amplifier configurations and those of skill in the art will appreciate that others are possible.

The driver amplifier assembly further includes a photodetector amplifier 244. The photodetector amplifier 244 has an input signal port coupled to the output of the photodetector 260 and an output port coupled to the test system switch 220 via signal line 228. The photodetector amplifier 244 may further include a control line (not shown) coupled to the drive controller 230 for controlling its operation (e.g., gain and/or output power). The photodetector amplifier 244 is also a high speed digital/ high frequency analog device in its preferred embodiment and able to handle signals within one or more of the aforementioned frequency ranges with a minimal of signal distortion. In one embodiment, the photodetector amplifier 244 consists of the aforementioned operational amplifier AD8001 operational amplifier available from Analog Devices Corporation. Of course, other amplifiers are compatible with the present invention and may be used alternatively.

The e-o transceiver 130, 140 further includes a laser module 250 configured to convert and optically communicate the received data. In one embodiment, the laser module 250 includes a laser 252, a laser power sensor module 254 and a laser temperature sensor module 256. In an alternative embodiment, a heating and/or cooling element (e.g., a Peltier junction) may be included to control the operating temperature of the laser 252 in response to control signals supplied from the drive controller 230.

The laser 252 includes a signal input configured to receive the driving signal 242a and an optical output for providing a modulated optical output 252a. A variety of laser structures may be used. For instance, the laser 252 may be a homojunction surface or edge-emitting light emitting diode (LED), a single or multiple heterostructure laser diode (LD) or other laser type. Moreover, the laser module 250 may be designed to emit light at a substantially single mode wavelength or, alternatively, capable of transmitting light in multiple modes or wavelengths simultaneously, for instance in wavelength division multiplexing (WDM) systems. In case of the latter, the laser 252 may include multiple signal inputs for receiving parallel signals, thereby generating a multiple wavelength output corresponding to the parallel signal input.

In addition, if a semiconductor laser is used, a number of different materials may be employed. For instance, $SiO_2$, GaP, GaAs, GaAsP, AlGaAs, and InGaAsP, are only a few of the possible materials which may be used. Those skilled in the art will appreciate that the present invention is not limited to a laser of a specific type, and that lasers of other architectures and/or semiconductor materials may be used in alternative embodiments.

The power sensor 254 includes a sensor output coupled to sensor line 234a for communicating power monitoring signals relating to the output power of the laser 252. In one embodiment, the laser power sensor includes a monitoring photodiode which is optically coupled to the laser 252 and operable to convert the coupled power to an electronic signal for detection by the drive controller via sensor line 234a. Of course, other laser power sensing structures are possible.

The temperature sensor module 256 includes a sensor output coupled to the sensor line 234b for communicating temperature monitoring signals relating to the operating temperature of the laser 252. In one embodiment, the temperature sensor 256 includes a temperature sensing circuit (not shown) which incorporates a precision temperature sensor such as part number LM45B available from the National Semiconductor Corporation. In response to the temperature varying resistance, the temperature sensing circuit will exhibit changes in its operating point which is detectable by the drive controller 230 via sensor line 234b. Other temperature sensing circuits may be used alternatively.

In one embodiment the laser, power, and/or temperature sensor modules 252, 254 and 256 are monolithically formed and integrated onto a single device using semiconductor processing techniques. The integrated construction facilitates manufacturing and obviates the need for interconnecting lines between the modules 252, 254 and 256. As an example, in one embodiment a laser module 250 having an integrated laser 252 and power sensor module 254 is the 1305 nm single-mode, InGaAsP laser diode (part number FU-411SDF) available from the Mitsubishi Corporation of Japan. An example of a multi-mode laser having an integrated laser and power sensor module 252 and 254 is the Mitsubishi ML4102A 780 nm AlGaAs laser. Other components are available which integrate the laser, power and/or temperature sensor modules.

In an alternative embodiment, some or all of the components 252, 254 and 256 may be separately formed. For instance, the laser 252 may be separately fabricated (perhaps using a more efficient semiconductor material and/or more precise processing technique) from the power and temperature sensor modules 254 and 256 which may be themselves separately or integrally formed. As appreciable to those skilled in the art, separate fabrication of the laser 252 may provide advantages such as improved laser performance as well as higher yield, lower cost and greater reliability in the construction of the laser module 250.

If separately processed, the laser 252 will include sensor outputs (not shown) coupled to communicate the laser power and operating temperature to sensor modules 254 and 256, respectively. In one embodiment, an optical power splitter is used to couple a portion of the laser output power from the laser 252 to the laser power sensor module 254. In one embodiment, the photodetector 260 is a PIN diode, such as part number 1A358 available from the Mitel Corporation.

Optimum performance and accurate control of the laser 252 is in part obtained through monitoring the output signal power through the laser power sensor 254. As more completely described in applicant's co-pending patent application "Drive Controller and Method of Operation," Ser. No. 60/173,056, the drive controller 230 performs a laser output power calibration sequence in which the controller 230 senses the monitoring photodiode current at one or more operating points of the laser module 250, and develops a transfer characteristic of sensed power to optical output power. In response, the drive controller 230 may adjust the operating point of the laser module 250, the gain/attenuation of the laser amplifier/driver 242, or a combination of both in order to return the laser 252 into the desired window of operation. Sensed temperature data as well as other operating conditions may also be used.

The e-o transceiver 200 further includes an photodetector 260 operable to detect the received optical signal 260a and provide a received electronic signal 260b in response. Depending upon the system architecture, the photodetector 260 may be designed to have a relatively narrow spectrum overwhich the received light is converted efficiently. For instance, in systems in which a single wavelength of light is used to communicate between units, a relative narrow photosensitive spectrum is used to reduce background noise and interference. Alternatively, the photodetector 260 may operate over a wider photosensitive spectrum. For instance, the e-o interface 130 may be used in a WDM system in which two or more optical wavelengths are transmitted (either from the same e-o transceiver or from different e-o transceivers). In this instance, the photodetector 260 is designed to exhibit a wide photosensitive spectrum overwhich the received light may be converted into electronic signals Further, the photodetector 260 may be realized in a variety of different architectures. For instance, the photodetector 260 may be a reversed biased P-N photodiode, a P-I-N diode, an avalanche photodiode (APD), photosensitive transistors, PIN-FETs, as well as other structures. In addition, the photodetector may be made from a wide variety of semiconducting materials, a few examples being $SiO_2$, GaP, GaAs, GaAsP, AlGaAs, and InGaAsP. Those skilled in the art will appreciate that other photodetector topologies and semiconducting materials may be used in alternative embodiments. In one embodiment, the photodetector 260 is a PIN diode, such as part number 1A358 available from the Mitel Corporation.

Optical connectors 272 and 274 provide a low-loss optical connection to the laser 252 and photodetector 260 from the fiber optic cable 135. A beam expander (not shown) may be used to facilitate alignment of the connection. In one embodiment, the optical connectors 272 and 274 are FC-PC connectors, such as part number HPC-S0.1 connectors available from the Rifocs Corporation. In an alternative embodiment in which a free-space optical link is utilized, optical lenses may alternatively be used to collect the transmitted beam.

Although not shown, an optical coupling device may be used to route the transmitted and received optical signals 272a and 274a. The optical coupling device may consist of a directional optical coupler, an optical circulator, an optical switch, or other optical processing components.

Referring back to FIG. 1A, data is communicated between the first and second e-o transceivers 130 and 140 via a fiber optic cable 135. In one embodiment, the fiber optic cable 135 is a duplex fiber cable having two conductive lines for supplying power and ground voltages. In another embodiment, a single mode fiber cable is used such as the SMC-A1060B cable manufactured by the Spectran Corporation. In a third embodiment, a multi-mode fiber cable is used, such as the 530T-01-100S manufactured by the Chromatic Technologies Corporation.

In one embodiment of the invention, the e-o transceiver 130, 140 establishes an e-o link between an electronic system 110 and an optical system (not shown) coupled to the optical channel. The optical system may include optical components such as optical amplifiers, filters, mixers, switches, optical computers, optical processors, or other optically-based devices, circuits and/or systems.

FIG. 1B illustrates a second embodiment of the e-o interface system 150. In this embodiment, the first and second transceivers 130 and 140 are differentiated by the laser and photodetector modules 250 and 260, respectively. Specifically, the first e-o transceiver 130 includes a laser 252 which emits light at a first wavelength $\lambda_1$ and a photodetector 260 that detects light at a second wavelength $\lambda_2$. The second e-o transceiver 140 includes complementary wavelength components; a laser 252 which emits light at the second wavelength $\lambda_2$ and a photodetector 260 which detects light at the first wavelength $\lambda_1$.

The e-o interface system 150 communicates data in the forward direction (from the first to the second e-o transceiver) using the first wavelength $\lambda_1$ and in the reverse direction using the second wavelength $\lambda_2$. The fiber optic cable 135 may be either a single fiber cable capable of supporting the propagation of optical signals at both wavelengths with minimal loss and dispersion, or alternatively, a dual fiber optical cable having dedicated fibers for propagating each wavelength.

FIG. 2B illustrates a second embodiment of the e-o transceivers 130 and 140. In this embodiment, the transceivers 130 and 140 are configured to operate in a wavelength division multiplexing (WDM) system.

The first and second e-o transceivers 130 and 140 each include n transceiver slices 280, each slice having a connector 212, an emulator 216, a test system switch 220, a laser driver/amplifier 242 and photodetector amplifier 244, a laser module 250, and a photodetector 260. A single drive controller 230 is coupled to and controls each of the transceiver slices 280 via bus lines 285, wherein each bus line $128_x$ includes signal, control, ground, power, sensor and other lines, described above for the e-o transceiver of FIG. 2A. Each of the transceiver slices 280 operates as described above to communicate dc or ac signals in digital or analog form between the first and second electronic systems 110 and 120.

The laser module $250_x$ within each of the transceiver slices 280 is designed to emit light at a unique wavelength. A wavelength combiner 290, such as those manufactured by GCA Fiberoptics Ltd., combines light of different wavelengths to produce an output spectrum along the optical channel, a fiber optic cable 135 in the illustrated embodiment. In this manner, the e-o transceiver 130, 140 can communicate multiple channels of data simultaneously between the first and second electronic systems 110 and 120. Other optical components, such as an optical multiplexer, may be alternatively used to combine the optical outputs.

III. Electo-Optic System Operation

Figure 5A:
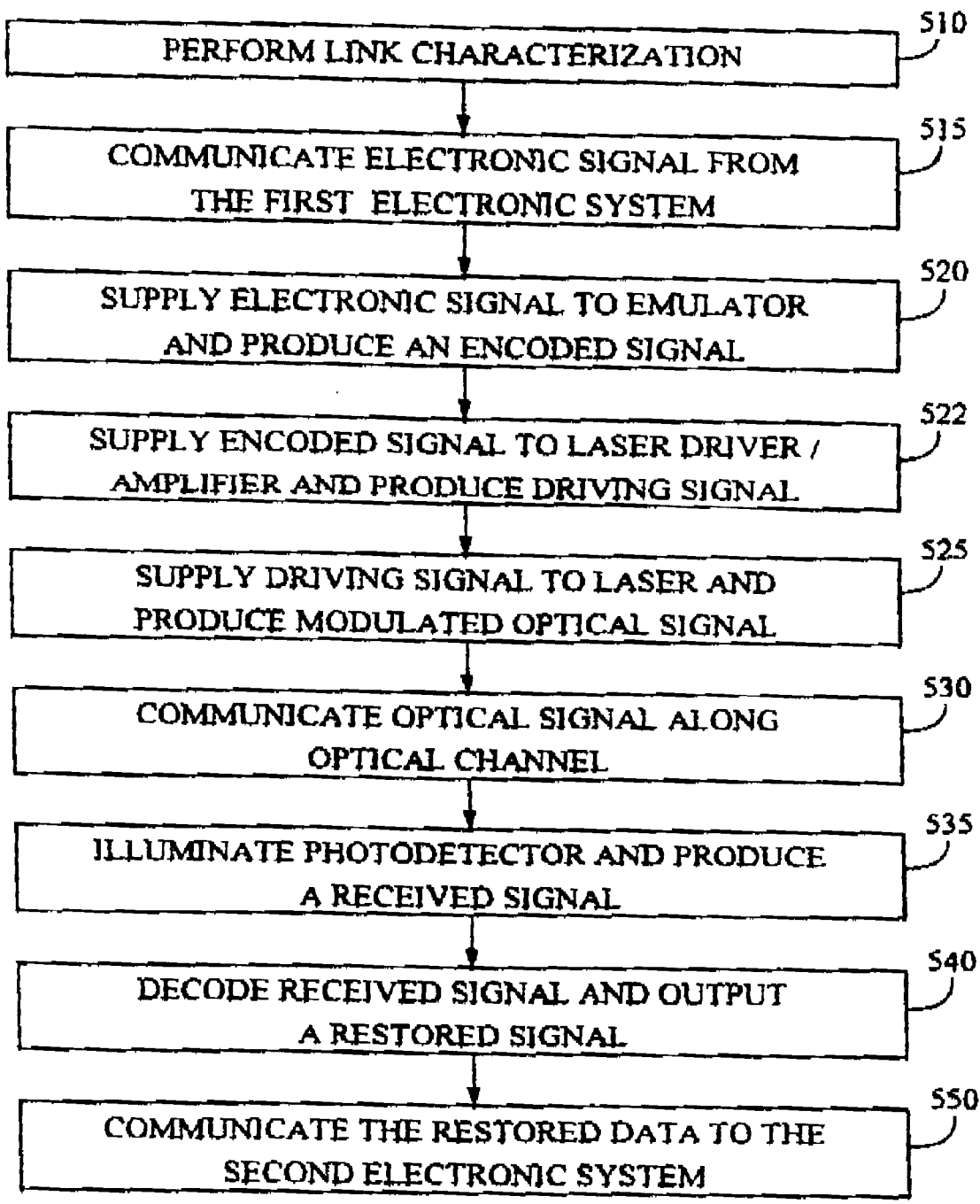
FIG. 5A illustrates a flowchart describing the operation of the electro-optic interface system in accordance with one embodiment of the present invention.
Figure 5B:
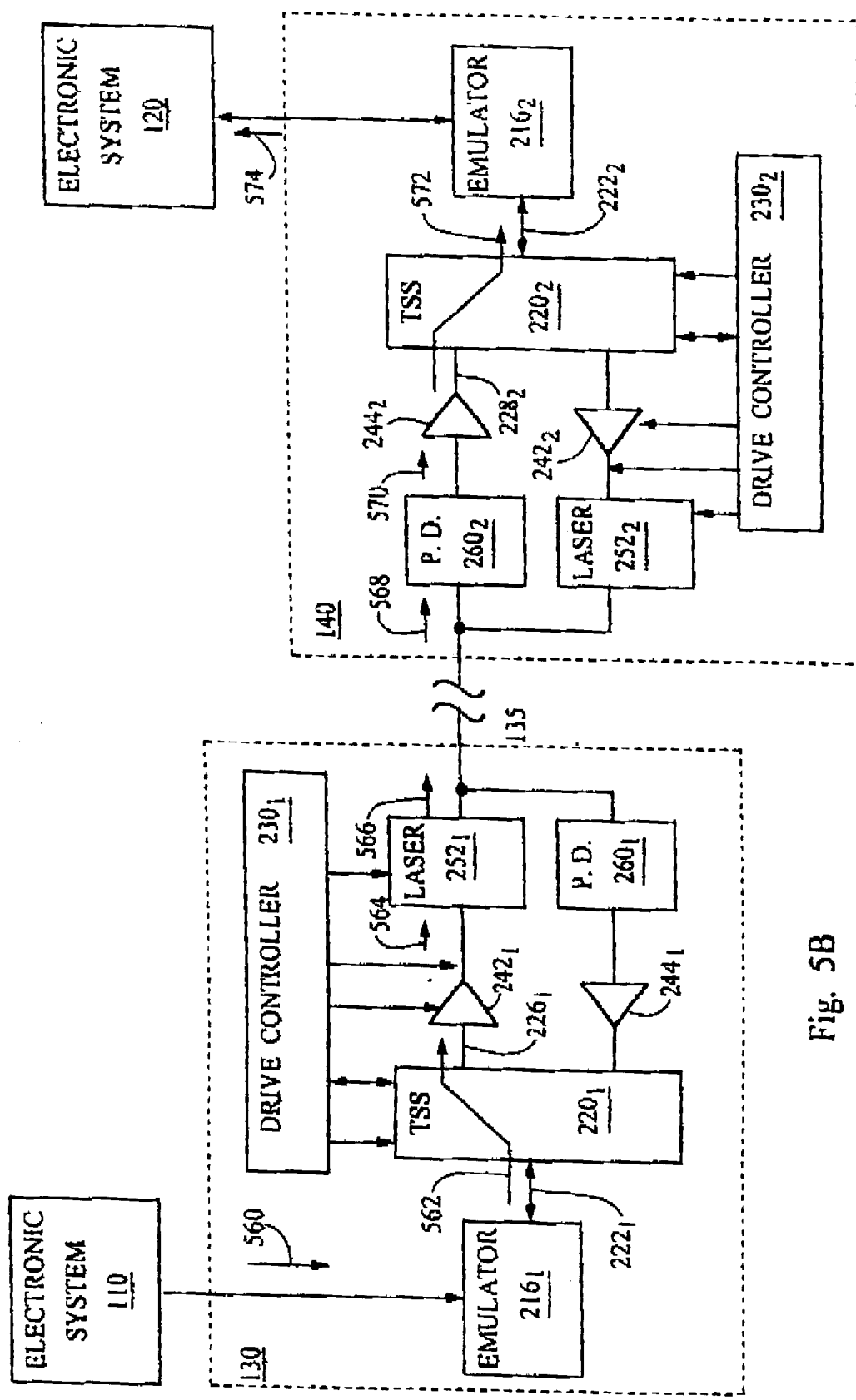
FIG. 5B illustrates the signal flow with a representative link dung the signal communication process described in FIG. 5A.

FIG. 5A illustrates a flowchart describing the operation of the electro-optic interface system 100 shown in FIGS. 1A and 1B The method is illustrated for a digital communication system configured to optically communicate data in a half-duplex transmission mode, although those of skill in the art will appreciate that the method may be modified to describe the operation of a digital or analog communication system operable in a simplex or full-duplex transmission modes. FIG. 5B illustrates the signal flow within a representative link during the signal communication process described in FIG. 5A.

Initially at 510, a link characterization is performed to determine the existence and quality of the communication link between electronic systems 110 and 120. This process is further illustrated in FIG. 6 and described below.

Next at 515 (FIG. 5), an electronic signal 560 is communicated from the electronic system 110. This process may be achieved using a USB, SCSI or other bus-type connector. The electronic signal 560 may be a dc or ac signal, in digital or analog form. In the illustrated embodiment, the electronic signals are parallel digital bits.

Subsequently at 520, the electronic signal 560 is supplied to the first transceiver emulator circuit 216, which encodes the electronic signal, producing an encoded signal 562. In the illustrated embodiment, this encoding process includes the processes of time stamping and serializing the parallel bits.

Next at 522, the encoded signal is supplied to a first transceiver laser driver/amplifier $242_1$, which in response produces a driving signal 564. This process is performed by controlling the first transceiver test system switch $220_1$, to couple the signal paths $222_1$ and $226_1$, together.

The first transceiver laser driver/amplifier $242_1$ is operable to provide sufficient gain/attenuation such that the driving signal 564 corresponding to a "0" or lowest logic level of the electronic signal 560 produces a driving signal 564 which is slightly above the threshold current of the first transceiver laser $252_1$. In another embodiment in which linear operation is desired, the first transceiver laser driver/amplifier $242_1$ provides sufficient gain and output power such that the driving signal 564 corresponding to the electronic signal 560 modulates the first transceiver laser $252_1$ over a substantially linear region of the laser output power response.

Next at 525, the driving signal 564 is injected into the first transceiver laser $252_1$, which in response, produces a modulated optical signal 566. In the illustrated embodiment, the first transceiver laser $252_1$ is a single mode laser which is modulated by a driving signal 564 composed of serial bits having a "0" or logic low level set slightly above the laser's threshold point. Accordingly, when a "1" or high state is received in the serial data, the laser is modulated on and emits a burst of light. Alternatively, when a "0" or low state is received, the laser is modulated substantially near it threshold current.

Next at 530, the modulated optical signal 566 is communicated along the optical channel 135 and a received optical signal is provided at the second e-o transceiver 140. In the illustrated embodiment, optical communication is a fiber optic cable which has minimal signal loss and dispersion. In an alternative embodiment, the process may be performed by using a free-space optical link. Additional optical devices such as an optical combiner, coupler, or circulator may be used to facilitate optical communication.

Next at 535, the received optical signal illuminates the second transceiver photodetector $260_2$ which, in response, produces a received signal 570. In one embodiment, the received signal exhibits a modulation characteristic which is substantially identical to the driving signal 564, although some variation will occur due to quality of the communication link. For example, in the illustrated embodiment in which the driving signal 564 is a digital signal, the received signal 570 is substantially a digital signal having substantially the same waveshape, although the two signals may differ in amplitude and bit value in a few instances. The second transceiver photodetector $260_2$ may comprise a single or multimode wavelength detector, in which case the second transceiver photodetector $260_2$ will output one or multiple received signals, respectively.

Next at 540, the received signal is supplied to a second transceiver emulator circuit $216_2$ which decodes the received signal 572 and produces a restored signal 574. In the illustrated embodiment, this process is performed by controlling the second transceiver test system switch $220_2$ to couple the signal paths $228_2$ and $222_2$ together.

The decoding process 540 comprises the reverse of 520. In the illustrated embodiment, the decoding process 540 includes reading the aforementioned time-stamps encoded in the encoded signal 562, de-serializing the serial bits based upon the time stamp, and level shifting the de-serialized (parallel) bits to the appropriate level required for the second electronic system 120. Additional signal conditioning (de-emphasis) may be included to compensate for the dispersion effects encountered during signal transmission.

At 550, the restored data (parallel digital bits) 574 is communicated to the peripheral device in parallel form. This process may be achieved using an USB, SCSI, GPIB, or other bus-type connector to facilitate connection between the second e-o transceiver 140 and the electronic system 120.

The foregoing illustrates only one possible embodiment of the method for operating the e-o interface systems described herein and those of skill in the art will appreciate that the method of operation of the disclosed e-o interface systems is not limited to the foregoing method. The e-o interface systems described herein may be operated using modified, altered or equivalent methods to achieve the same results.

IV. Link Characterization

Figure 6A:
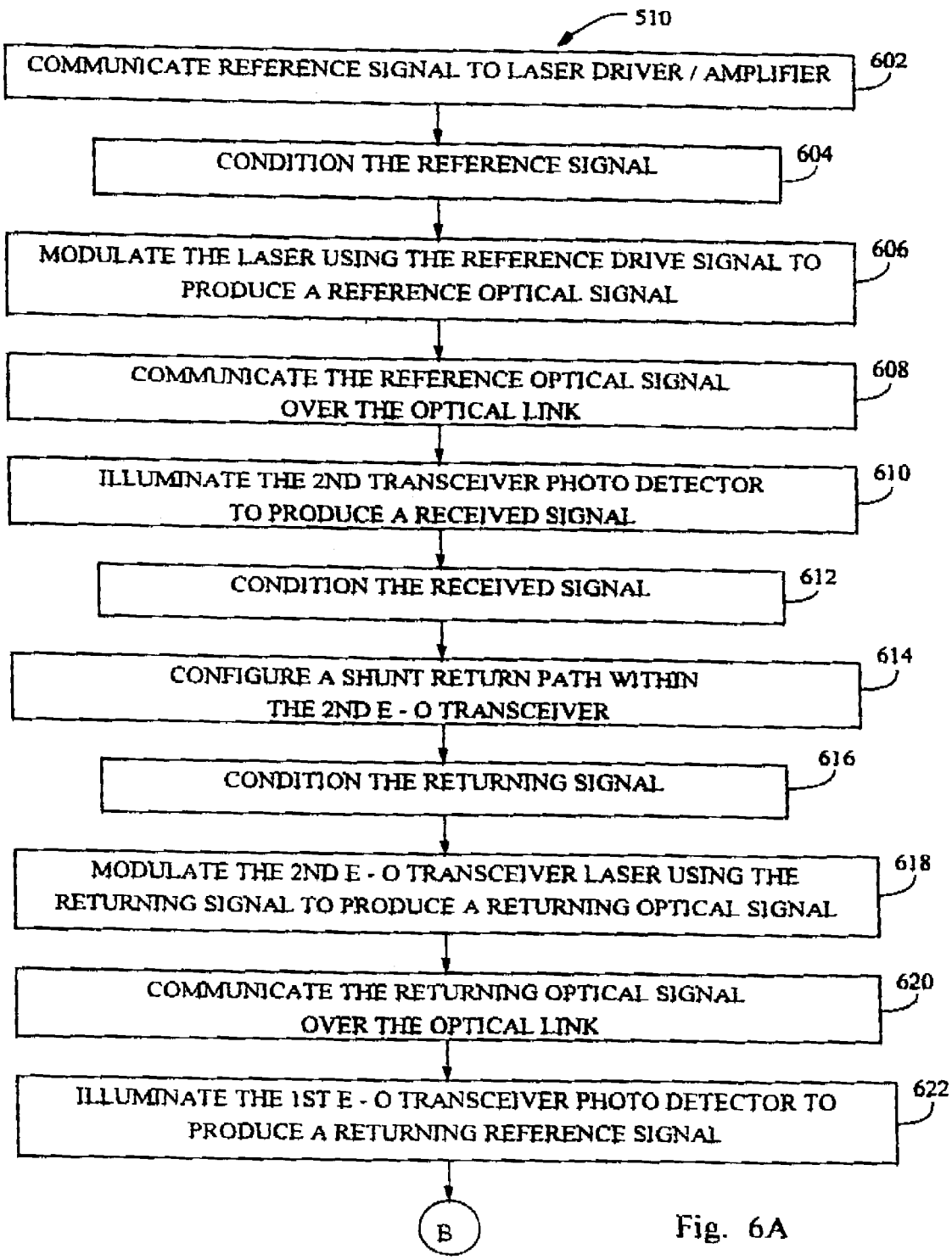
FIGS. 6A and 6B illustrate a flowchart describing one embodiment of a link characterization performed in accordance with one embodiment of the present invention.
Figure 6B:
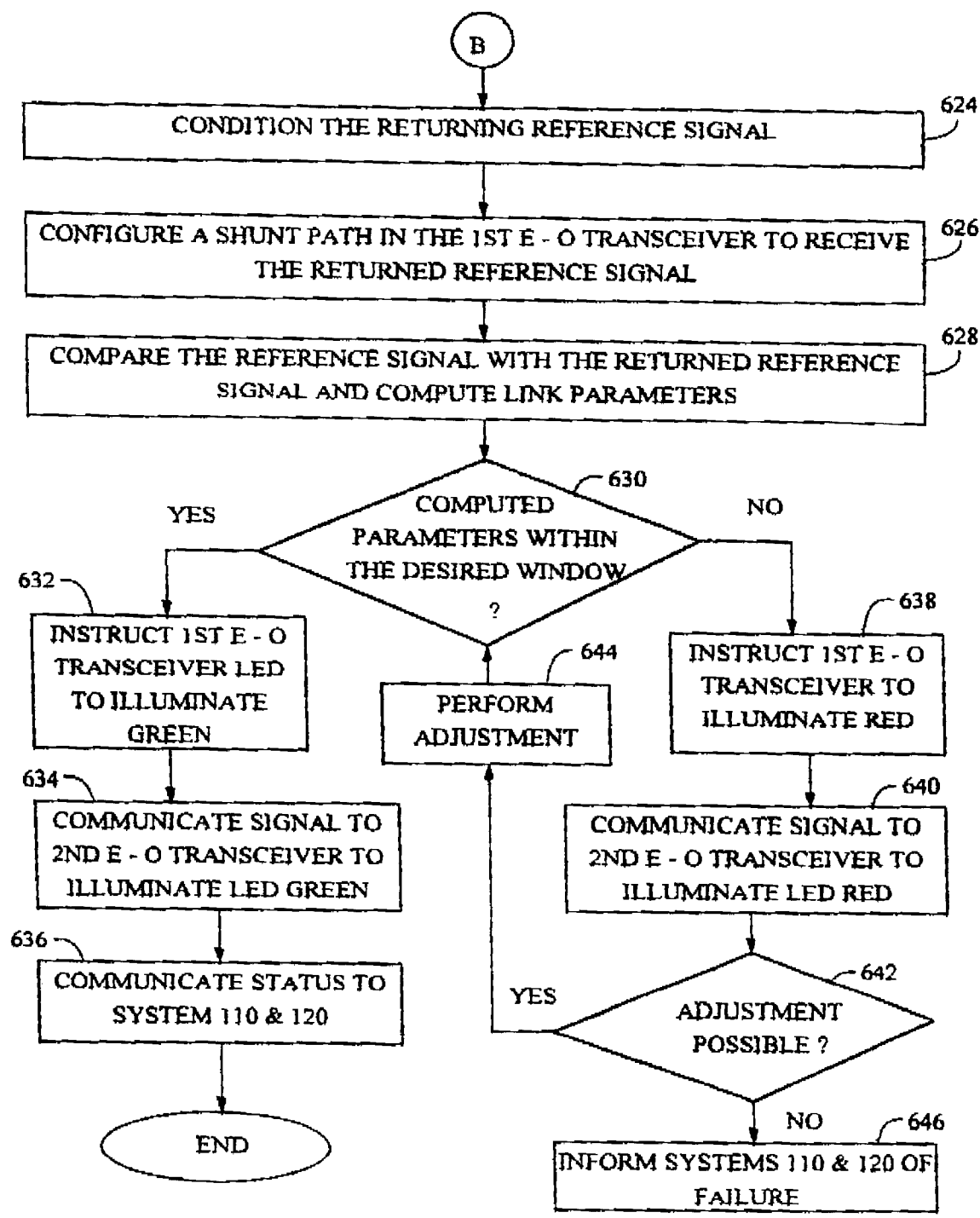
Figure 6C:
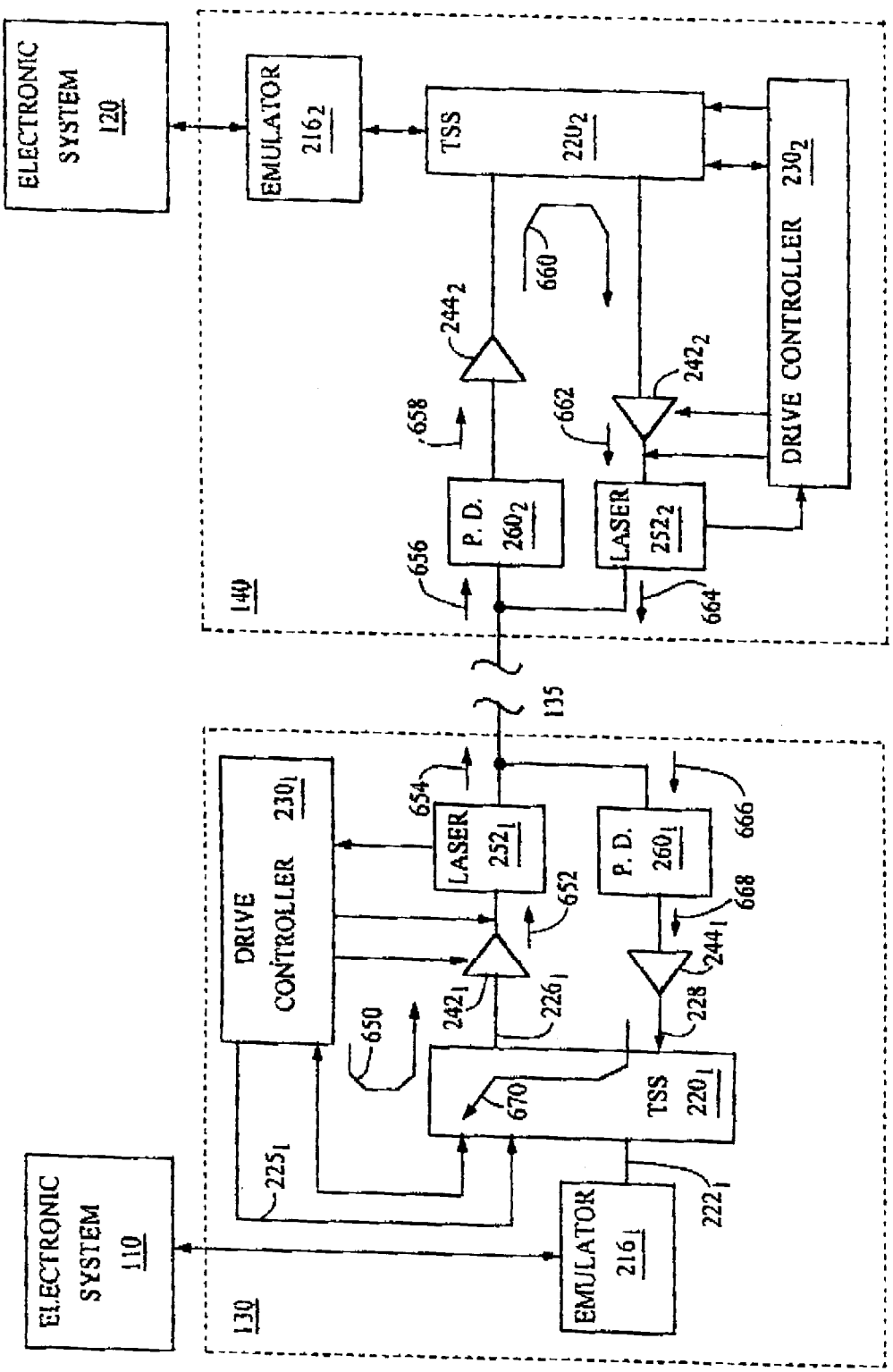
FIG. 6C illustrates the signal flow within a representative link undergoing the link characterization process described in FIGS. 6A and 6B.

FIGS. 6A and 6B illustrate a flowchart describing a link characterization 510 shown in FIG. 5A in accordance with the present invention. The link characterization process 510 enables the user(s) of the electronic systems 110 and 120 to determine if a satisfactory communication link has been established or if an established link remains intact. The link characterization may be performed prior to communicating data between electronic systems and/or periodically thereafter to ensure link satisfactory operation. FIG. 6C illustrates the signal flow within a representative link undergoing the link characterization process described in FIGS. 6A and 6B.

Initially at 602, a reference signal 650 is supplied to the first transceiver laser driver/amplifier $242_1$ in the e-o first transceiver 130. In the illustrated embodiment, this process is performed by controlling the test system switch $220_1$ to connect the signal line $225_1$ to the input of the laser driver/amplifier $242_1$ and supplying a reference ac or dc signal from the first transceiver drive controller $230_1$. As further described in applicant's concurrently filed provisional patent application entitled "Drive Controller and Method of Operation," Ser. No. 60/173,056, the first transceiver drive controller 230, includes a signal generator which produces a reference signal 650 for the link characterization process. In an alternative embodiment, the reference signal 650 is supplied to the input of the first transceiver laser $252_1$ directly. Further alternatively, multiple reference signals may be provided by the drive controller $230_1$ to provide a multi-wavelength test signal using the e-o transceiver 130, 140 described in FIG. 2B.

Next at 604, the reference signal 650 is conditioned, thereby producing a reference drive signal 652. This step is executed in the illustrated embodiment by level-shifting the serial bits, such that the reference drive signal 652 corresponding to a "0" or lowest logic level is slightly above the threshold current of the laser 252. In another embodiment in which a linear link characterization is desired, the laser driver/amplifier $242_1$ provides sufficient gain and output power such that the reference drive signal 652 corresponding to the reference signal 650 modulates the laser $252_1$ over a substantially linear region of the laser output power response. As described above, this step may be omitted if the reference drive signal(s) 652 is provided directly to the laser $252_1$.

At 606, the reference drive signal 652 is provided to the first transceiver laser $252_1$ which, in response, produces a reference optical signal 654. A single mode or multimode laser may be used to generate the reference optical signal 654 responsive to the supplied reference signal or signals, respectively.

At 608, the reference optical signal 654 is communicated over the optical link. In the illustrated embodiment, the process is performed by communicating the reference optical signal over a fiber optic cable to provide a received optical signal at the second e-o transceiver 140. The received optical signal 656 is differentiated from the reference optical signal 654 by connector and signal losses and dispersion due to the bandwidth limitations of the fiber cable. In an alternative embodiment, this process may be performed by using a free-space optical link.

At 610, the received optical signal 656 illuminates the second transceiver photodetector $260_2$, which, in response provides a received signal 658. In the illustrated embodiment this process is achieved by employing a PIN diode photodetector. In alternative embodiments, other photodetector structures may be used.

At 612, the received signal 658 is conditioned by the second transceiver photodetector amplifier $244_2$ to produce a returning signal 660. This process may include level-shifting, amplification, attenuation, filtering and/or other electronic processing of the received signal.

At 614, a shunt return path within the second e-o transceiver 140 is configured. In the illustrated embodiment, this process is performed by commanding the second transceiver drive controller $230_2$ to set the second transceiver test system switch $220_2$ therein to connect the output of the photodetector amplifier $260_2$ to the input of the second transceiver laser driver/amplifier $242_2$. In an alternative embodiment, the return path is configured by connecting the photodetector output to the laser input without routing the returning signal 660 through the photodetector amplifier $244_2$ and/or the laser driver/amplifier $242_2$.

At 616, the returning signal 660 is conditioned by the laser driver/amplifier $242_2$ to produce a return drive signal 662. In the illustrated embodiment, this process is performed by controlling the laser driver amplifier $242_2$ to impart substantially the same gain, attenuation, filtering, and/or other signal processes to the returning electronic signal 662 as would be imparted to an electronic signal originating from the test system switch $220_2$ so that the link may be accurately accessed. This process may be omitted if the photodetector output is coupled to the laser input during the link characterization process.

At 618, the return drive signal 662 is supplied to the second transceiver laser $252_2$, which, in response generates a returning optical signal 664. This process is achieved in the illustrated embodiment through the use of a single mode laser, although a multimode laser may be used for the link characterization as well.

At 620, the returning optical signal 664 is communicated over the optical link to produce a returned optical signal 666 at the first e-o transceiver 130. Compared to the returning optical signal 664, the returned optical signal 666 will exhibit signal and/or waveform degradation due to connector and signal losses and dispersion due to the bandwidth limitations of the fiber cable 135. In an alternative embodiment, this process may be performed by using a free-space optical link.

At 622, the returned optical signal 666 illuminates the first transceiver photodetector $260_1$, which, in response outputs a returning reference signal 668. In the illustrated embodiment, this process is achieved by employing a PIN diode photodetector. In alternative embodiments, other photodetector structures may be used.

At 624, the returning reference signal 668 is conditioned by the first transceiver photodetector amplifier $244_1$, and in response outputs a returned reference signal 670. In the illustrated embodiment, this process is performed by amplifying the returned reference signal.

At 626, a shunt path within the first e-o transceiver 130 is configured to receive the returned reference signal 670. In the illustrated embodiment, this process is performed by controlling the first transceiver test system switch $220_1$ to connect the photodetector output $228_1$ to the drive controller signal line $225_1$. As further described in applicant's co-pending patent application entitled "Drive Controller and Method of Operation," Ser. No. 60/173,056, the drive controller $230_1$ includes a signal receiver for detecting and analyzing the returned reference signal 670. In an alternative embodiment, the first e-o transceiver shunt return path is configured by connecting the output of the photodetector $260_1$ to the drive(r) controller signal line $225_1$.

At 628, the first transceiver drive controller $230_1$ compares the reference signal 650 with the returned reference signal 670 to determine the existence and quality of the link between the first and second transceivers 130 and 140. This process may be performed in one embodiment by comparing the reference signal with the returned reference signal. In so doing, a variety of link parameters such as the signal-to-noise (SNR) ratio, bit error rate (BER), effective signal loss, effective channel noise, channel bandwidth, as well as other parameters may be computed. The process of 628 may also include repeating the processes of 602–626 using different reference signals. In this manner, link performance can be accurately simulated under different operating conditions.

Next at 630, a determination is made as to whether one, a predefined group or all of the computed link parameters are within the desired window. For purposes of the present invention, "the desired window" may be defined as (1) occurring within a predefined range, (2) exceeding a minimum quantity (such as a minimum SNR requirement), and/or (3) not exceeding a maximum quantity (such as a maximum NF or BER requirement). If the parameter(s) are determined to be within the desired window, the drive controller 240 sends a signal to the LED 231 to illuminate green, thereby indicating that a satisfactory link with the second e-o transceiver 140 has been established or continues (process 632). The drive controller may communicate a signal to the second e-o transceiver 140 via the aforementioned means to indicate that the link is satisfactory. The second e-o transceiver drive controller may subsequently send a signal to the LED indicator therein to illuminate green indicating a satisfactory link has been established or continues (process 634). Next at 636, the drive controllers communicate their status to their respective systems 110 and 120. In an alternative embodiment in which the e-o interface system is implemented in a USB embodiment, this process is omitted.

If at 630, a determination is made that one, a selected group, or all of the computed link parameters are not within the desired window, the drive controller 240 sends a signal to the LED indicator 231 to illuminate red to alert the user that the link has not been established or that the link has been interrupted (process 638). The drive controller may communicate a signal to the second e-o transceiver 140 via the aforementioned means to indicate that the attempted link is unsatisfactory or has been interrupted. The drive controller in the second e-o transceiver may subsequently send a signal to the LED indicator therein to illuminate red indicating that the link has not been established or interrupted (process 640). Alternatively or in addition, the electronic systems may include monitoring devices such as a display, printer, or other output devices configured to communicate to the user and/or system maintainer the computed link performance between the electronic systems 110 and 120. While the computed link performance may not meet a predefined parameter such as SNR or BER, the user(s) may not require such a high quality link and proceed or continue with data transmission.

The drive controller within the first and/or second e-o transceivers may be operable to attempt to diagnose and/or improve the link performance by varying one or more of the operating conditions of the components under its control in light of sensed system performance. For instance, if high signal loss is sensed and the drive controller in the first e-o transceiver detects lower than optimum output power, the drive controller within the first e-o transceiver 130 may be programmed to begin to increment signal gain corresponding to the respective laser driver/amplifier 242 until optimum laser output is achieved and the minimum link parameter is attained. Of course, other scenarios are possible in which the system is intelligently able to diagnose and correct for link degradation.

If the drive controller(s) are operable to adjust the operating conditions of their respective e-o transceivers, a determination is made at 642 as to whether the conditions are such that an adjustment may improve the link performance. As described above, this determination may be assessed based upon various factors including the sensed transmitted and/or received power, operating conditions, such as temperature, power dissipation, drive signal level, received signal level, computed link parameters or the like. The drive controller(s) may be programmed to adjust any of the operating conditions within its control based upon one or more of these factors. Further, the number of attempts to improve the link may be used as a factor in deciding whether adjustment is possible. For instance, there may be a point at which little or no link improvement is realized. In this instance, the drive controller(s) may be programmed to attempt no further adjustment.

If, given the operating conditions, the drive controller(s) determine(s) that it is possible to improve the link performance, an adjustment is attempted (process 644). As described above, the adjustment may be made at one or both e-o transceivers, for one or more of the operating parameters under the control of the respective drive controller. After that adjustment, the process returns to 630, at which point the aforementioned link parameter(s) are recomputed to determine if an improvement was realized. In one embodiment, only the link parameter(s) which were outside of the desired window are recomputed in order to expedite link repair.

If at 642, a determination is made that link improvement is not possible, the process continues at 646 where the drive controllers inform their respective electronic systems 110 and 120 of the link failure.

In addition to the aforementioned processes, the link characterization 510 may further include configuring the test system switch 220 to connect the emulator line 222 to the drive controller signal line 225 so as to monitor the signal output from the emulator 216. This process provides a local diagnostic capability from the electronic system 110 to the transceiver 130 (and correspondingly from the second electronic system 120 to the second e-o transceiver 150). Thus, the local and link diagnostic capabilities collectively provide a diagnostic capability over the entire link from the first electronic system 110 to the second electronic system 120.

The methods of FIGS. 5 and 6 may be implemented in a multitude of different forms (i.e. software, hardware, or a combination of both). In one embodiment, the described methods may be implemented as a software program executed within the processor of the drive controller to control the respective e-o transceivers 130, 140. This process is further described in applicant's concurrently filed provisional patent application "Drive Controller and Method of Operation", Ser. No. 60/173,056.

V. Applications

The e-o interface systems 100 and 150 of FIGS. 1A and 1B, respectively, may be implemented in a variety of different applications to optically communicate data between two or more electronic systems. The following examples are present as only a few of the possible applications of the systems and methods described herein. Those of skill in the art will appreciate that numerous other applications may benefit from the e-o interface system described herein.

Figure 7:
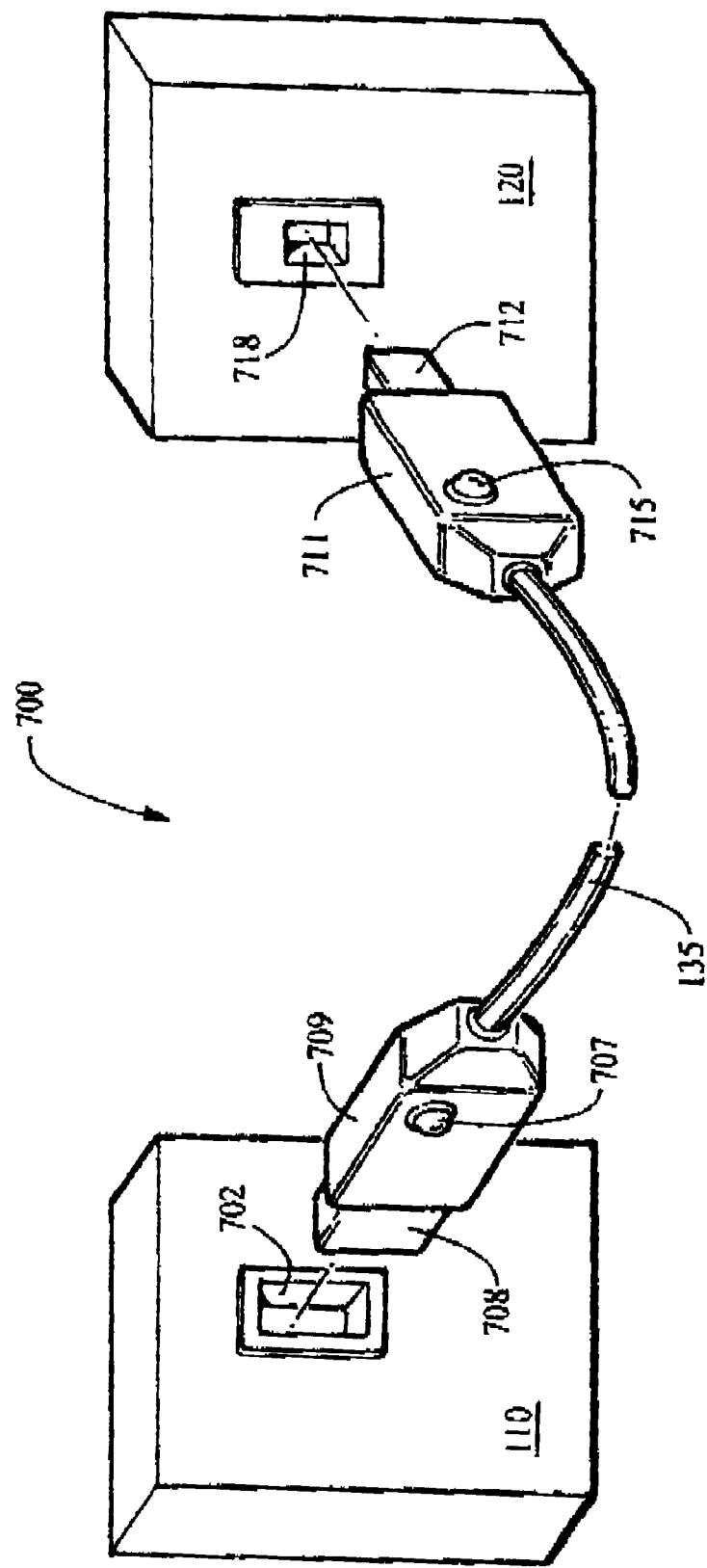
FIG. 7 illustrates the electro-optic interface system as embodied in a universal serial bus in accordance with one embodiment of the present invention.

FIG. 7 illustrates the e-o interface system as embodied in a universal serial bus (USB) configured to communicate signals between a host system 110 and a peripheral device 120. The USB bus can be constructed to provide varying of degrees of speed, bandwidth and link quality. For instance, the USB bus is configured to provide a moderate speed communication link using inexpensive laser diodes, multi-mode optical fibers and inexpensive optical fiber connectors as well as inexpensive computer interface emulators. In an alternative embodiment, a higher speed link may be constructed using single mode lasers and higher quality fiber optic cable and other components.

A duplex fiber optic cable 700 is connected to first and second e-o transceivers 130 and 140 which are encased in connector housings 709 and 711, respectively. A host USB connector 708 and a peripheral USB connector 712 extend from connector housings 709 and 711, respectively, to engage corresponding USB connectors 702 and 718 located on the computer 110 and the peripheral device 120, also respectively. As illustrated, the computer and peripheral device connectors 708 and 712 may be of different sizes to ensure proper connection.

Each of the connector housings 709 and 711 may include one or more LED indicator lights 707 and 715 operable to provide a visual indication of one or more aspects of the system. For instance, the LEDs 707 and 715 may illuminate green when a link of suitable transmission quality has been established between the computer 110 and peripheral device 120. Alternatively, the same or another LED may illuminate red when a suitable link has not been established. In alternative embodiments, some or all portions of the e-o transceivers 130 and 140 may be fabricated within the line of the computer bus line, within the connector, within the computer 110, or located on a device card installed in the computer 110 and/or in the peripheral device.

Figure 8:
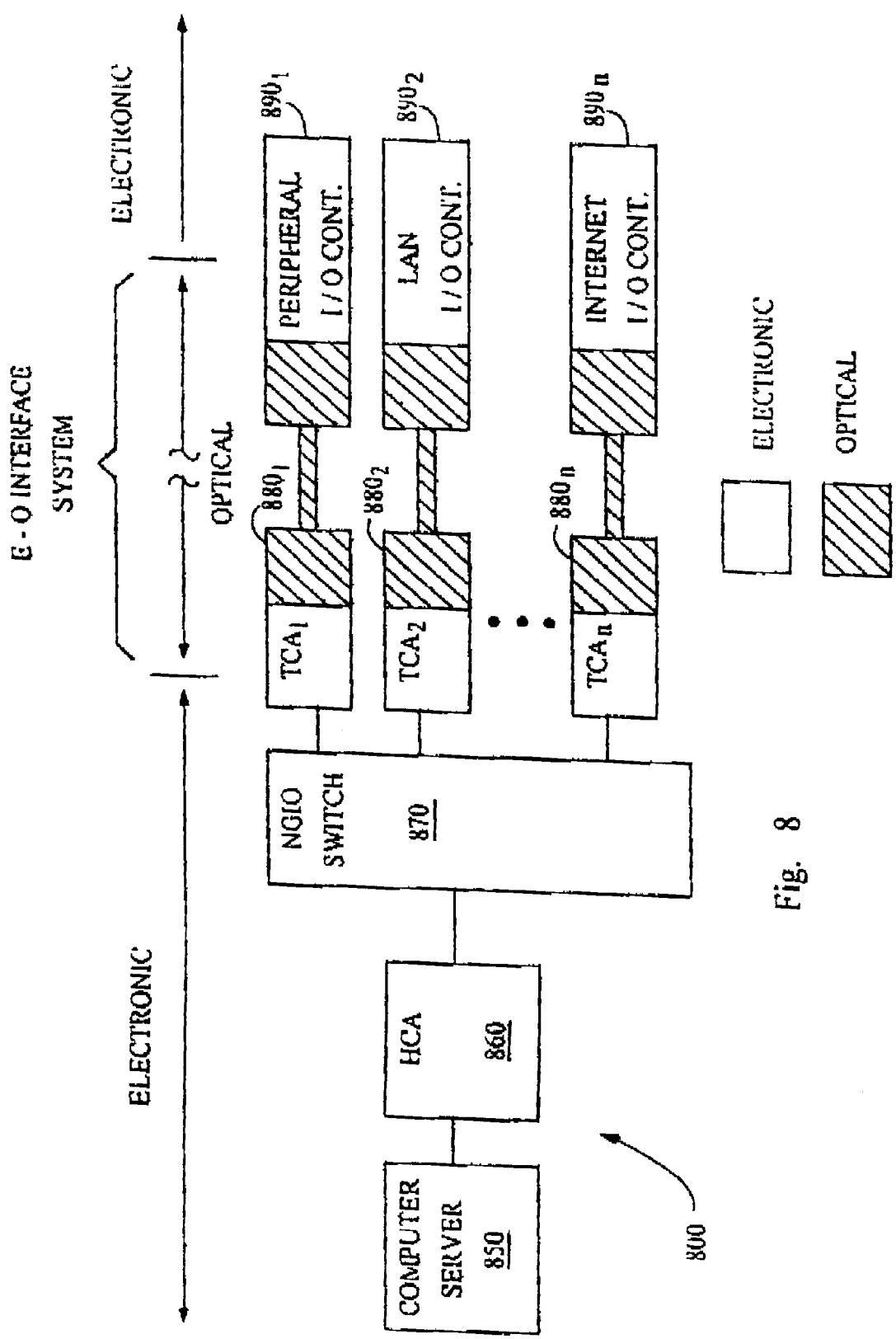
FIG. 8 illustrates the electro-optic interface system as embodied in a next generation input/output system in accordance with one embodiment of the present invention.

FIG. 8 illustrates the e-o interface system as embodied in a next generation input/output (NGIO) system 800 in which a computer server 850 is coupled to a host channel adapter (HCA) 860. The HCA 860 is coupled to a bank of switching networks (an NGIO switch) 870 which contains the hardware and protocols necessary to fan out the communication to one or more devices. Each output of the NGIO switch 870 is coupled to a target channel adapter (TCA) 880, which in turn, provides connectivity to a variety of different components and networks such as to peripheral devices, a local area network or the Internet 890.

The NGIO system 800 is similar to the network architecture employed in a mainframe computer system in which the server computer, memory, and memory management are included within one computer system and the peripheral devices are included within a second computer system. The architecture (referred to as an I/O channel) frees the server computer from management of computer peripherals and communications which tends to slow down the server computer. It is contemplated that the NGIO architecture will be adopted in a variety of applications including providing connectivity to the Internet where the computer server 850 operates as a web server to which one or more of the I/O controllers 890 includes an internet link. In this embodiment, the e-o interface system of the present invention may be established between a variety of points, including between a TCA 880 and an I/O controller 890 and configured in a manner similar to that shown in FIG. 1A.

Figure 9:
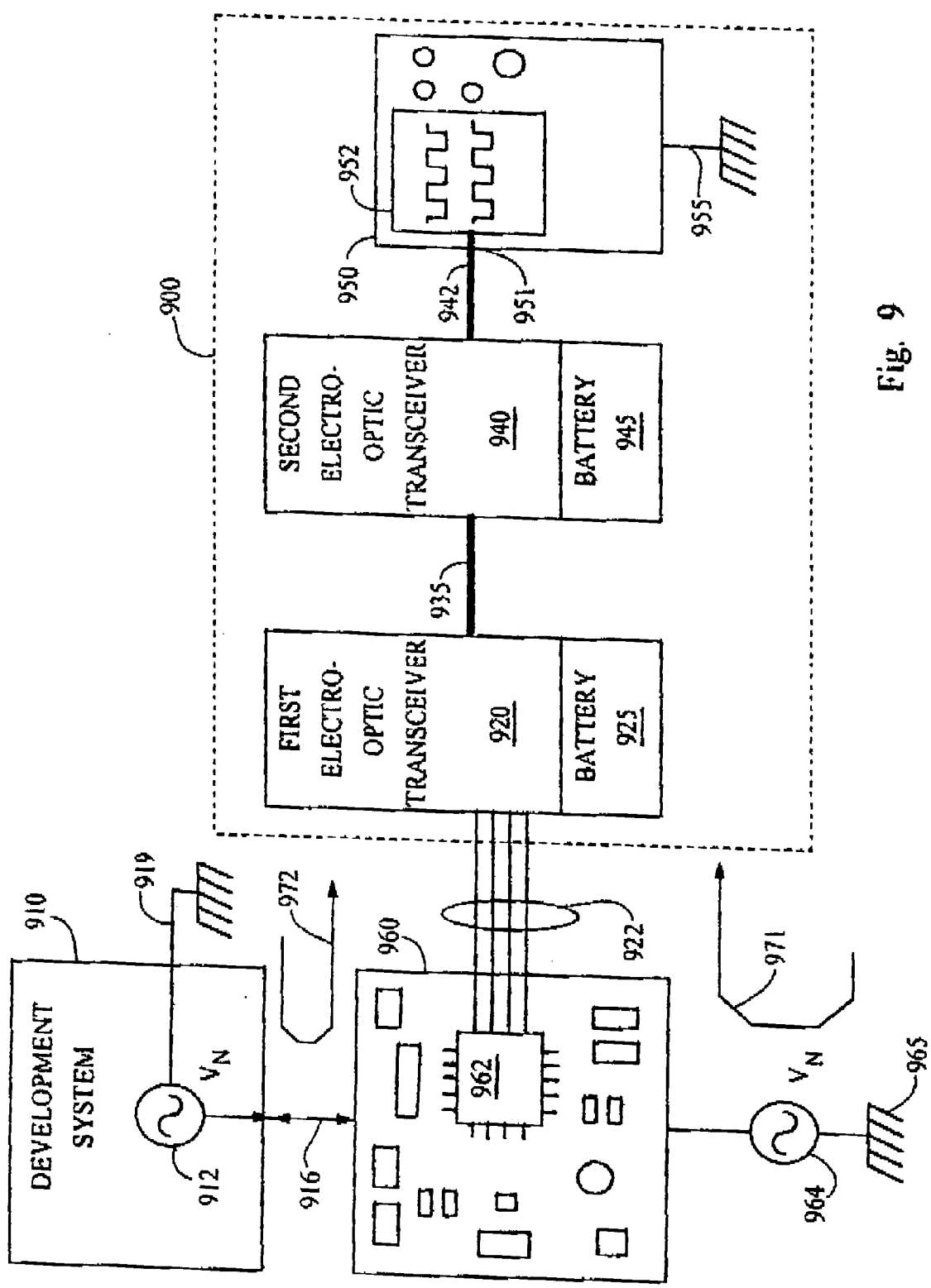
FIG. 9 illustrates the electro-optic interface system as embodied in a logic analyzer system in accordance with one embodiment of the present invention.

FIG. 9 illustrates the e-o interface system as embodied in a logic analyzer isolator 900 useful for testing a logic circuit 962, such as a microprocessor. The isolator 900 includes a first e-o transceiver 920 having one or more logic probes 922, a fiber optic cable 935, a second e-o transceiver 940, a bus line 942 and a logic analyzer 950. A logic circuit 962 under test may be located on a motherboard 960. A development system 910 couples to the motherboard 960 via a bus line 916 and is used to develop and test the circuit's firmware and operation. Preferably, the fiber optic cable 935 electrically isolates the first e-o transceiver 920 from the second e-o transceiver and does not include an electrically conductive line, such as a power or ground line therebetween. Electronic isolation between the first and second transceivers 920 and 940 may be accomplished through the use of battery-powered supplies 925 and 945, or alternatively, through separate ac or dc power supplies.

During operation, one or more parallel logic probes 922 are coupled to the logic circuit 962. The logic probes 922 detect the states occurring along the probed point, each probe typically defining a parallel channel which may be displayed on the logic analyzer display 952. The probes are coupled to an emulator located within the first e-o transceiver 920 which converts the parallel channels of the probed data into a serialized data stream. The serialized data may be encoded with a time stamp as described above to aid in the parallel reconstruction of the data in the second e-o transceiver 940. Within the first e-o transceiver 920, the serialized data is conditioned and injected into the laser transmitter module which, in response, provides a modulated light output along the fiber optic cable. The photodetector within the second e-o transceiver 940 receives the modulated light signal and outputs a received electronic signal representing the transmitted serialized data. The received electronic signal is conditioned, de-serialized, and presented to the parallel detector ports 951 of the logic analyzer via bus line 942. The logic analyzer 950 senses the signals at the detector ports 951 and displays the detected states for each probe channel on the display 952. One or more probe channels may be displayed simultaneously. The data from one or more probe channels may be mathematically combined to display, for instance a sum or difference of two probe channels.

Implementation of the e-o interface system with the logic analyzer improves the electronic isolation between the logic analyzer and the logic circuit under test 962. Specifically noise sources 912 and 964 attributable to the development tool and system ground noise from other devices will conduct noise currents 971 and 972 to ground via ground terminals 914 and 965. Because the logic analyzer 950 is also connected to ground via terminal 955, the noise currents 971 and 972 may propagate to the logic circuit under test 962 if the communication path 935 was electrically conductive. However, because the communication path is optical and the first and second transceivers 920 and 940 are electrically isolated, the ground currents 971 and 972 are not provided a return path via the logical circuit under test 962. In this manner, development and evaluation of the logic circuit can be performed more accurately.

In an alternative embodiment, the first e-o transceiver 920 consists of an e-o transmitter operable to transmit data and the second e-o transceiver 940 consists of an e-o receiver operable to receive data. In this embodiment, the e-o transmitter 920 is the above-described e-o transceiver 130 without the associated reception circuitry. For instance, the photodetector 260, the photodetector amplifier 244 may be excluded and the bi-directional signal lines may modified as unidirectional signal lines for propagating signals in a single direction. Further, the e-o transmitter emulator may be constructed without the de-serializer or associated circuitry. Other modifications of an e-o transceiver to operate as a e-o transmitter will be apparent to those skilled in the art.

The e-o receiver 940 is similarly modified to include only the reception components and circuitry. For example, the laser driver/amplifier 242 and the laser module 250 may be excluded. Further, the e-o receiver emulator may be constructed without the serializer or associated circuitry. Other modifications of an e-o transceiver to operate as a e-o receiver will be apparent to those skilled in the art.

The present invention has been described with reference to specific embodiments. Other embodiments will be apparent to those skilled in the art in view of the foregoing description. It is therefore intended that this invention not be limited except as indicated by the appended claims:

What is claimed is:

1. An electro-optic transceiver configured to communicate signals between an electronic system and an optical system, having an electro-optic interface comprising:
   a test system switch having a signal port configured to communicate electronic signals between the test system switch and the electronic system, a control input configured to receive a switch control signal, a first signal output, and a first signal input;
   a laser having an input coupled to the first signal output of the test system switch and an optical output coupled to the optical system; and
   a photodetector having an optical input coupled to the optical system and an output coupled to the first signal input of the test system switch, the photodetector configured to receive a first optical signal from the optical system and in response produce a received signal,
   wherein the test system switch, responsive to the switch control signal, couples the electronic signal to the laser input to produce a first modulated output signal, thereby communicating the electronic signal from the electronic system to the optical system, or couples the received signal to the electronic system, thereby communicating the optical signal from the optical system to the electronic system.

2. The electro-optic transceiver of claim 1, further comprising an emulator circuit having an input coupled to the electronic system and an output coupled to the signal port of the test system switch, the emulator circuit configured to receive the electronic signal from the electronic system comprising parallel data and to produce in response serialized data for communication with the optical system.

3. The electro-optic transceiver of claim 2, wherein the emulator circuit comprises a data serializer.

4. The electro-optic transceiver of claim 2, wherein the emulator circuit further comprises a data de-serializes having air input coupled to output of the photodetector and an output coupled to the electronic system, the data de-serializes configured to receive the received signal comprising serialized data and to produce in response parallel data.

5. The electro-optic transceiver of claim 4, further comprising a laser driver/amplifier having an input coupled to the first signal output of the test system switch and an output coupled to the input of the laser, the laser driver/amplifier configured to receive the serialized data and in response provide a drive signal, wherein an output level of the drive signal corresponding to the lowest logic level of the serialized data comprises a level which is above a threshold current level of the laser.

6. The electro-optic transceiver of claim 5, further comprising a power sensor having an input coupled to the laser and a sensor output coupled to the laser driver/amplifier, the laser power sensor configured to sense an output power of the laser and to produce in response a monitoring signal for controlling the laser driver/amplifier.

7. The electro-optic transceiver of claim 6, further comprising a temperature sensor having an input coupled to the laser and a sensor output coupled to the laser driver/amplifier, the laser power sensor configured to sense operating temperature of the laser and to produce in response the monitoring signal for controlling the laser driver/amplifier.

8. The electro-optic transceiver of claim 1, further comprising a laser driver/amplifier having an input coupled to the first signal output of the test system switch and an output coupled to the input of the laser, the laser driver/amplifier configured to receive the electronic signal and in response provide a drive signal, wherein an output level of the drive signal corresponding to the electronic signal modulates the laser over a substantially linear portion of the laser output power response.

9. The electro-optic transceiver of claim 1, further comprising a second test system switch having a signal port configured to communicate second electronic signals between the second test system switch and the electronic system, a control input configured to receive a second switch control signal, a first signal output, and a first signal input;
   a second laser having an input coupled to the first signal output of the second test system switch and an optical output coupled to the optical system; and
   a second photodetector having an optical input coupled to the optical system and a signal output coupled to the first signal input of the second test system switch, the second photodetector configured to receive a second optical signal from the optical system and in response produce a second received signal,
      wherein the second test system switch, responsive to the second switch control signal, couples the second electronic signal to the input of the second laser, thereby communicating the second electronic signal from the electronic system to the optical system, or couples the second received signal to the electronic system, thereby communicating the second optical signal from the optical system to the electronic system.

10. The electro-optic transceiver of claim 9, wherein the first optical signal comprise a first wavelength and the second optical signal comprises a second wavelength.

11. An electro-optic transceiver configured to communicate signals between an electronic system and an optical system, having an electro-optic interface comprising:
   a test system switch having a signal input coupled to the electronic system, a control input, a first signal output, and a second signal output, the test system switch configured to receiving an electronic signal from the electronic system;
   a drive controller having a control output coupled to the control input of the test system switch, a signal input coupled to the first signal output of the test system switch, the drive controller configured to communicate a switch control signal to the test system switch via the output control; and
   a laser having a signal input coupled to the second signal output of the test system switch and an optical output coupled with the optical system,
      wherein the test system switch, responsive to the switch control signal, switches the electronic signal to the drive controller via the first signal output or to the laser via the second signal output.

12. A electro-optic transceiver configured to communicate signals between an electronic system and an optical system, having an electro-optic interface comprising:
   an emulator circuit having an input coupled to receive an electronic signal from the electronic system and an output, the emulator circuit configured to receive parallel data and output serialized data;
   a laser driver/amplifier having a signal input coupled to emulator output and an output, the laser driver/amplifier configured to provide a driving signal corresponding to the electronic signal; and
   a laser having an input coupled to the laser driver/amplifier signal output and an optical output coupled to the optical system, the laser configured to receive the driving signal and in response output a modulated optical signals,
      wherein the driving signal corresponding to the lowest logic level of the electronic signal is above a threshold current of the laser.

13. An electro-optic interface system configured to communicate, via an optical channel, a signal between a first and a second electronic system, the system comprising:
   a first electro-optic transceiver having a signal port coupled to the first electronic system and an optical port, the first electro-optic transceiver comprising a first transceiver laser having an input coupled to the first electronic system and an optical output, wherein the first transceiver laser produces a first modulated output signal corresponding to a signal communicated from the first electronic system;
   an optical channel coupled to the laser output, wherein the optical channel supports propagation of the first modulated optical output therethrough; and
   a second transceiver having a first port coupled to the optical channel and a second port coupled to the second electronic system, the second transceiver comprising:
      a second transceiver test system switch having a signal port configured to communicate electronic signals between the second transceiver test system switch and the second electronic system, a control input configured to receive a first switch control signal, a first signal output, and a first signal input;
      a second transceiver laser having an input coupled to the first signal output of the second transceiver test system switch and an optical output coupled to the optical channel; and
      a second transceiver photodetector having an optical input coupled to the optical channel and an output coupled to the first signal input of the second transceiver test system switch, the second transceiver photodetector configured to receive the first modulated output signal emitted by the first transceiver laser and, in response, produces a first received signal, wherein the second transceiver test system switch, responsive to the first switch control signal, switches the first received signal between the second electronic system ad the input of the second transceiver laser.

14. The electro-optic interface system of claim 13, wherein the first electro-optic transceiver further comprises:

a first transceiver photodetector having an optical input coupled to the optical channel and an output, the photodetector configured to receive a second modulated optical signal emitted by the second transceiver laser, and in response, produces a second received signal, and a first transceiver test system switch having a signal port configured to communicate electronic signals to the first electronic system, a control input configured to receive a second switch control signal, a first signal output coupled to the first transceiver laser, and a first signal input coupled to the output of the first transceiver photodetector;

wherein the first transceiver test system switch, responsive to the second switch control signal, couples the first electronic signal to the laser input to produce the first modulated output signal, or couples the second received signal to the first electronic system.

15. The electro-optic interface system of claim 14, wherein the first transceiver laser produces the first modulated optical signal at a first wavelength and the second transceiver laser produces the second modulated optical signal at a second wavelength, and wherein the first transceiver photodetector includes an input which is photosensitive at the second wavelength and the second transceiver photodetector includes an input port which is photosensitive at the first wavelength.

16. An electro-optic interface system configured to communicate, via an optical channel, an electronic signal between a first and a second electronic system, the system comprising:

a first electro-optic transceiver having a signal port coupled to the first electronic system and an optical port, the first electro-optic transceiver comprising:

a first transceiver emulator circuit having an input coupled to the electronic system and an output, the first transceiver emulator circuit configured to receive an electronic signal comprising parallel data from the first electronic system and, in response, produces in response serialized data; and a first transceiver laser having an input coupled to the output of the first transceiver emulator circuit and a optical output, wherein the first transceiver laser produces a first modulated output signal corresponding to the electronic signal communicated from the first electronic system;

an optical channel coupled to the laser output, wherein the optical channel supports the propagation of a first modulated optical output therethrough;

a second electro-optic transceiver having a first port coupled to the optical channel and a second port coupled to the second electronic system, the second transceiver comprising:

a second transceiver photodetector having an optical input coupled to the optical channel and an output, the second transceiver photodetector configured to receive the first modulated output signal emitted by the first transceiver laser and, in response, produces a first received signal; and a second transceiver emulator circuit having an input coupled to the second transceiver photodetector output and an output coupled to the second electronic system, the second transceiver emulator circuit configured to receive the received signal comprising serialized data and to produce in response parallel data.

17. The electro-optic interface system of claim 16, wherein the first electronic system comprises a host system comprising a host socket and the second electronic system comprises a peripheral system comprising a peripheral socket, the interface system further comprising:

a host connector having a first port configured to engage the host socket on the host system and a second port coupled to the first electro-optic transceiver; and a peripheral connector having a first port coupled to the second transceiver photodetector output for receiving the parallel data, the peripheral connector configured to engage the peripheral socket located on the peripheral system.

18. The electro-optic interface system of claim 16, wherein the first electronic system comprises a target channel adapter having an output coupled to the signal port of the first electro-optic transceiver and the second electronic system comprises an I/O controller having an input coupled to the second port of the second electro-optic transceiver.

19. The electro-optic interface system of claim 16, wherein the first electronic system comprises a logic probe having an output coupled to the signal port of the first electro-optic transceiver and the second electronic system comprises a logic analyzer having a detector port coupled to the second port of the second electro-optic transceiver.

20. An electo-optic interface system having a first electro-optic transceiver coupled to a second electro-optic transceiver via an optical channel, a method for characterizing a quality of a link between the first and second electro-optic transceivers, the method comprising the steps of:

modulating, using a reference optical signal, a laser within the first electro-optic transceiver to produce a reference optical signal;

communicating the reference optical signal over an optical channel to the second electro-optic transceiver;

illuminating a photodetector within the second electro-optic transceiver with a received optical signal corresponding to the reference optical signal to produce a received reference signal;

modulating, using the received reference signal, a laser within the second electro-optic transceiver to produce a reference optical signal;

illuminating a photodetector within the first electro-optic transceiver with a returned optical signal corresponding to the returning optical signal to produce the returned reference signal; and comparing the returned reference signal with the reference signal.

* * * * *

UNITED STATES PATENT AND TRADEMARK OFFICE
CERTIFICATE OF CORRECTION

| | |
|---|---|
| PATENT NO. | : 6,446,867 B1 |
| APPLICATION NO. | : 09/472709 |
| DATED | : September 10, 2002 |
| INVENTOR(S) | : Jorge Sanchez |

It is certified that error appears in the above-identified patent and that said Letters Patent is hereby corrected as shown below:

On the Title Page item 63:

In the Related U.S. Application Data, remove

"Continuation-in-part of application No. 08/988,865, filed on Dec. 11, 1997, now Pat. No. 6, 028, 423, which is a continuation of application No. 08/ 553, 340, filed on Nov. 22, 1995, now Pat. No. 5,736,727."

and replace with

--This is a Continuation in Part of application Serial Number 08/988,865 filed on Dec. 11, 1997 now U.S. Patent No. 6,028,423. In addition, the commonly owned concurrently filed provisional U.S. Patent application entitled "Drive Controller and Method of Operation", Serial Number 60/173,056 is herein incorporated by reference in its entirety for all purposes.--

In the Specification of the patent:

Column 1, in the CROSS-REFERENCE TO RELATED APPLICATIONS data, remove

"This is a continuation in part of application Ser. No. 08/988,865 filed on Dec. 11, 1997 now U.S. Pat. No. 6, 028, 423, herein incorporated by reference wherein is a continuation of Ser. No. 08, 553, 340 Nov 22, 1995 now U.S. Pat. No. 5,736, 727. In addition the commonly owned, concurrently filed provisional U.S. Patent application entitled "Drive Controller and Method of Operation," Ser. No. 60/173,056 is herein incorporated by reference in its entirety for all purposes."

UNITED STATES PATENT AND TRADEMARK OFFICE
CERTIFICATE OF CORRECTION

PATENT NO. : 6,446,867 B1
APPLICATION NO. : 09/472709
DATED : September 10, 2002
INVENTOR(S) : Jorge Sanchez It is certified that error appears in the above-identified patent and that said Letters Patent is hereby corrected as shown below:

and replace with

--This is a Continuation in Part of application Serial Number 08/988,865 filed on Dec. 11, 1997 now U.S. Patent No. 6,028,423. In addition, the commonly owned concurrently filed provisional U.S. Patent application entitled "Drive Controller and Method of Operation", Serial Number 60/173,056 is herein incorporated by reference in its entirety for all purposes.--

Signed and Sealed this

Fourteenth Day of October, 2008

JON W. DUDAS
*Director of the United States Patent and Trademark Office*